(12) United States Patent
Cho et al.

(10) Patent No.: US 9,577,137 B2
(45) Date of Patent: Feb. 21, 2017

(54) PHOTOVOLTAIC CELLS WITH MULTI-BAND GAP AND APPLICATIONS IN A LOW TEMPERATURE POLYCRYSTALLINE SILICON THIN FILM TRANSISTOR PANEL

(75) Inventors: An-Thung Cho, Hsinchu (TW);
Chih-Wei Chao, Hsinchu (TW);
Chia-Tien Peng, Hsinchu (TW);
Kun-Chih Lin, Hsinchu (TW)

(73) Assignee: AU OPTRONICS CORPORATION, Hsinchu (TW)

( * ) Notice: Subject to any disclaimer, the term of this patent is extended or adjusted under 35 U.S.C. 154(b) by 1764 days.

(21) Appl. No.: 12/202,647

(22) Filed: Sep. 2, 2008

(65) Prior Publication Data

US 2009/0009675 A1 Jan. 8, 2009

Related U.S. Application Data

(63) Continuation-in-part of application No. 11/876,516, filed on Oct. 22, 2007, now abandoned, which is a
(Continued)

(51) Int. Cl.
*H01L 31/04* (2014.01)
*H01L 31/0352* (2006.01)
(Continued)

(52) U.S. Cl.
CPC ....... *H01L 31/1804* (2013.01); *H01L 31/0352* (2013.01); *H01L 21/28273* (2013.01);
(Continued)

(58) Field of Classification Search
None
See application file for complete search history.

(56) References Cited

U.S. PATENT DOCUMENTS 5,039,354 A 8/1991 Nakagawa
5,066,340 A 11/1991 Iwamoto et al.
(Continued)

FOREIGN PATENT DOCUMENTS

CN 101231944 A 7/2008
CN 101237000 A 8/2008
(Continued)

OTHER PUBLICATIONS

Green, M. A. et al, All-silicon tandem cells based on "artificial" semiconductor synthesis using silicon quantum dots in a dielectric matrix, 20th European Photovoltaic Solar Energy Conference, Jun. 6-10, 2005, p. 3-7.*
(Continued)

*Primary Examiner* — Matthew Martin
*Assistant Examiner* — Christopher Danicic
(74) *Attorney, Agent, or Firm* — Tim Tingkang Xia, Esq.; Locke Lord LLP

(57) ABSTRACT

One aspect of the present invention relates to a photovoltaic cell. In one embodiment, the photovoltaic cell includes a first conductive layer, an N-doped semiconductor layer formed on the first conductive layer, a first silicon layer formed on the N-doped semiconductor layer, a nanocrystalline silicon (nc-Si) layer formed on a first silicon layer, a second silicon layer formed on the nc-Si layer, a P-doped semiconductor layer on the second silicon layer, and a second conductive layer formed on the P-doped semiconductor layer, where one of the first silicon layer and the second silicon layer is formed of amorphous silicon, and the other of the first silicon layer and the second silicon layer formed of polycrystalline silicon.

26 Claims, 15 Drawing Sheets

Related U.S. Application Data continuation-in-part of application No. 11/698,261, filed on Jan. 25, 2007, now Pat. No. 7,857,907.

(51) Int. Cl.
  *H01L 21/28* (2006.01)
  *H01L 27/12* (2006.01)
  *H01L 31/06* (2012.01)
  *H01L 31/10* (2006.01)
  *H01L 31/18* (2006.01)

(52) U.S. Cl.
  CPC .......... *H01L 27/12* (2013.01); *H01L 27/1214* (2013.01); *H01L 31/06* (2013.01); *H01L 31/10* (2013.01); *Y02E 10/547* (2013.01); *Y02P 70/521* (2015.11)

(56) References Cited

U.S. PATENT DOCUMENTS

| | | | |
|---|---|---|---|
| 6,090,666 A | 7/2000 | Ueda et al. | |
| 6,157,047 A | 12/2000 | Fujita et al. | |
| 6,784,103 B1 | 8/2004 | Rao et al. | |
| 6,846,474 B2 | 1/2005 | Nayfeh et al. | |
| 6,878,921 B2* | 4/2005 | Taguchi et al. | 250/214.1 |
| 7,141,834 B2 | 11/2006 | Atwater, Jr. et al. | |
| 7,816,751 B2 | 10/2010 | Cho et al. | |
| 2001/0042502 A1 | 11/2001 | Shih et al. | |
| 2002/0153522 A1 | 10/2002 | Park et al. | |
| 2003/0111106 A1* | 6/2003 | Nagano et al. | 136/255 |
| 2005/0076945 A1 | 4/2005 | Tachibana et al. | |
| 2005/0092357 A1* | 5/2005 | Deng | 136/252 |
| 2006/0211267 A1* | 9/2006 | Joshi et al. | 438/778 |
| 2006/0246301 A1* | 11/2006 | Stachowiak | 428/432 |
| 2007/0166916 A1 | 7/2007 | Solomon et al. | |
| 2008/0178794 A1 | 7/2008 | Cho et al. | |
| 2008/0179762 A1 | 7/2008 | Cho et al. | |
| 2008/0251116 A1* | 10/2008 | Green | 136/255 |

FOREIGN PATENT DOCUMENTS

| | | | | |
|---|---|---|---|---|
| JP | 2082655 A | 3/1990 | | |
| JP | 2224279 A | 9/1990 | | |
| JP | 2008182247 A | 8/2008 | | |
| WO | WO2005106966 | * 10/2005 | ......... | H01L 31/0264 |
| WO | 2005106966 A1 | 11/2005 | | |
| WO | 2008008555 A2 | 1/2008 | | |

OTHER PUBLICATIONS

Japan Patent Office, "Notice of Allowance", Oct. 9, 2012, Japan.

* cited by examiner

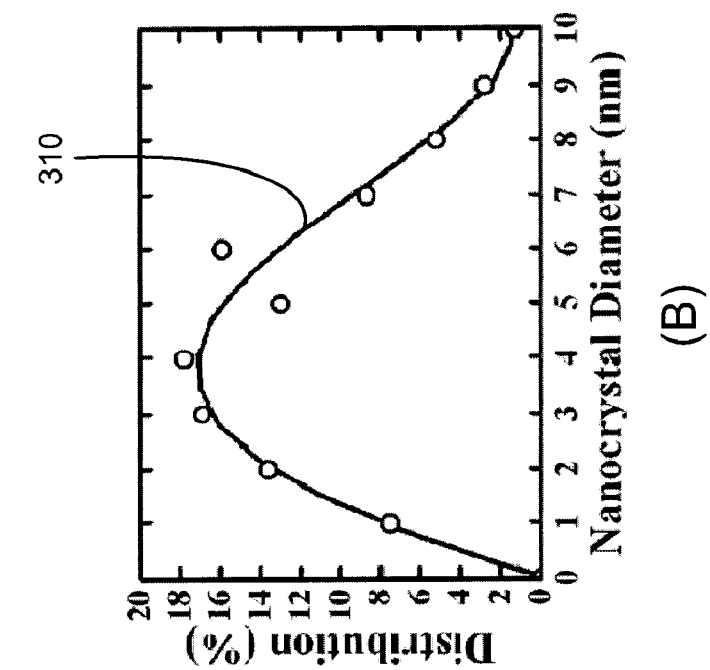
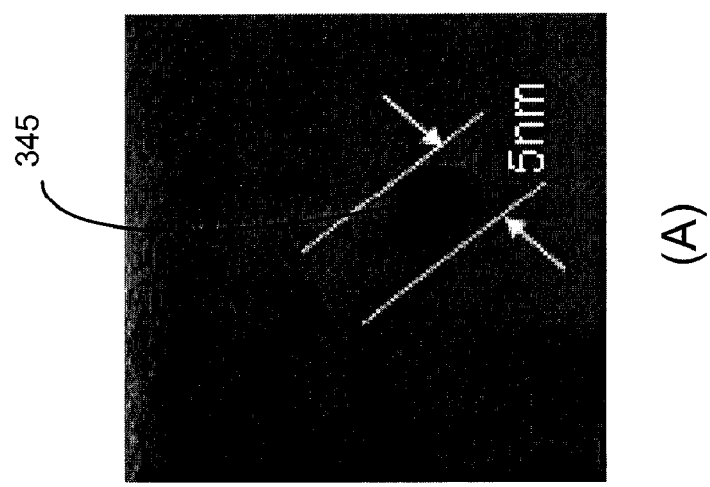
Fig. 3

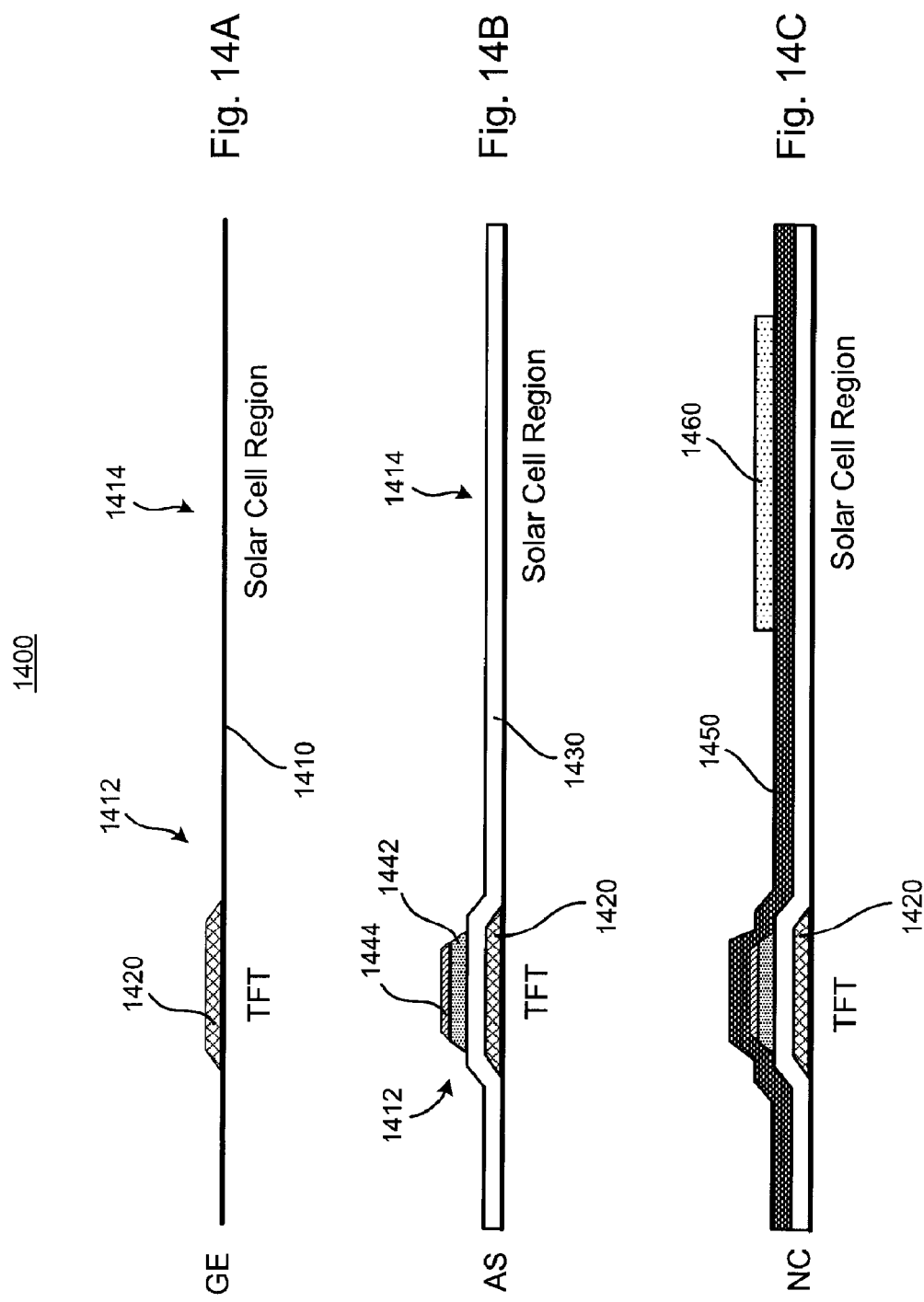

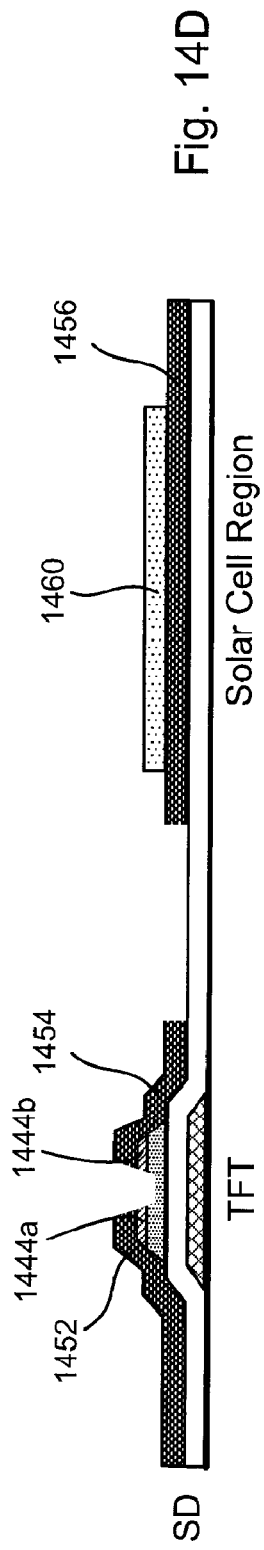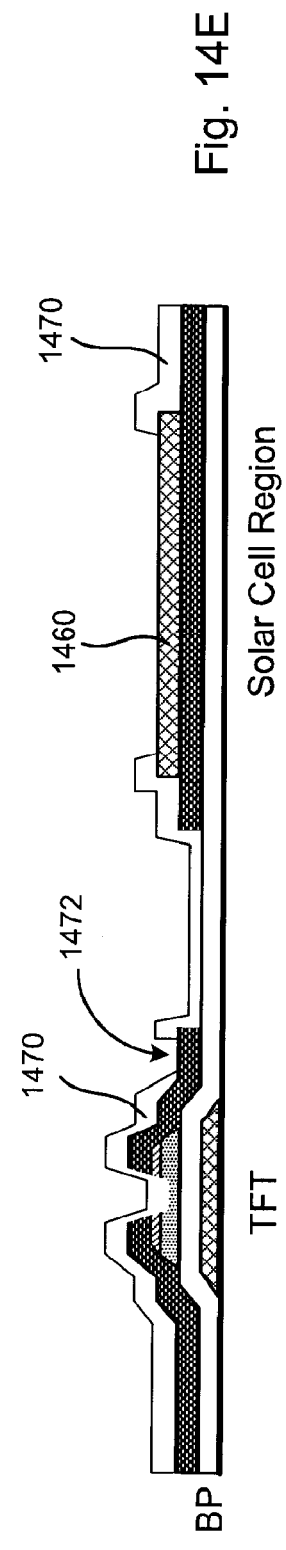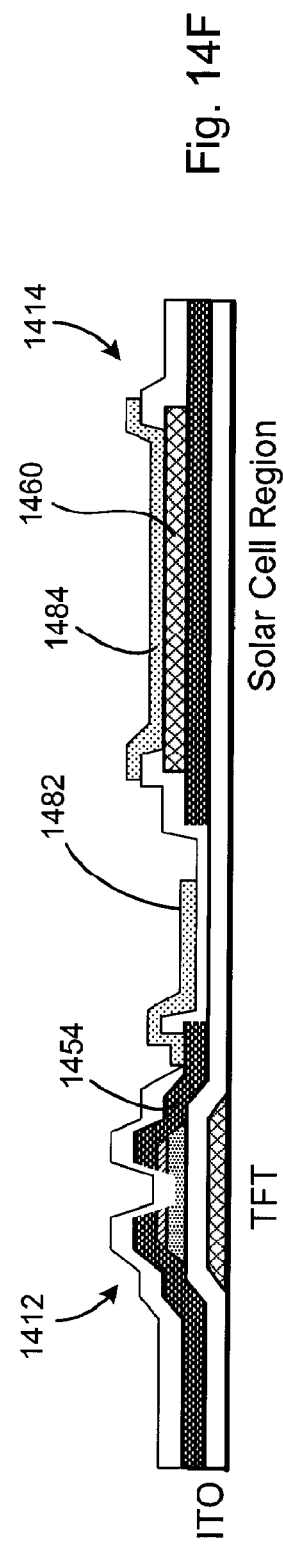

PHOTOVOLTAIC CELLS WITH MULTI-BAND GAP AND APPLICATIONS IN A LOW TEMPERATURE POLYCRYSTALLINE SILICON THIN FILM TRANSISTOR PANEL

CROSS-REFERENCE TO RELATED PATENT APPLICATION

This application is a continuation-in-part of U.S. patent application Ser. No. 11/876,516, filed Oct. 22, 2007, entitled "LAYERED STRUCTURE WITH LASER-INDUCED AGGREGATION SILICON NANO-DOTS IN A SILICON-RICH DIELECTRIC LAYER, AND APPLICATIONS OF THE SAME", by An-Thung CHO, Chih-Wei CHAO and Chia-Tien PENG, with the same assignee as that of this application, and which itself is a continuation-in-part of U.S. patent application Ser. No. 11/698,261, filed Jan. 25, 2007, entitled "METHODS OF FORMING SILICON NANOCRYSTALS BY LASER ANNEALING" by An-Thung CHO, Chih-Wei CHAO, Chia-Tien PENG, Wan-Yi LIU and Ming-Wei SUN, with the same assignee as that of this application. The disclosures of the above identified co-pending applications are hereby incorporated herein in their entireties by reference.

Some references, if any, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference.

FIELD OF THE INVENTION

The present invention relates generally to a photovoltaic cell and more particularly, to a photovoltaic cell having a photovoltaic conversion layer with a multi-band gap, and its applications in a low temperature polycrystalline silicon thin film transistor (LTPS-TFT) panel.

BACKGROUND OF THE INVENTION

A solar cell or photovoltaic cell is a semiconductor device that converts solar/optical energy of light into electrical power by the photovoltaic effect. Generally, a solar cell is configured as a large-area P-N junction made of silicon that has a layer of N-type (negative type) silicon and a layer of P-type (positive type) silicon direct contacting with the layer of N-type silicon. When a photon hits the solar cell, the photon can pass straight through the silicon if it has lower photon energy, or reflect off the surface, or be absorbed by the silicon if it has photon energy higher than the silicon band gap value. The latter generates an electron-hole pair and sometimes heat, depending on the band structure of the solar cell. Due to the interfacial electrical field of the P-N junction, the generated hole moves towards an anode on the P-type silicon layer, while the generated electron moves towards a cathode on the N-type silicon layer in the silicon solar cell, thereby producing electricity.

Materials used for solar cells include silicon, group III-V semiconductors (e.g., GaAs), groups II-VI semiconductors (e.g., CdS/CdTe), organic/polymer materials, and others. Of them, silicon solar cells including monocrystalline silicon wafer based solar cells, polycrystalline silicon (poly-Si) thin-film based solar cells and amorphous silicon (a-Si) thin-film based solar cells are most developed. Group III-V semiconductor based solar cells are formed on bulk Ge substrates and have high efficiency, but they are prohibitively expensive for all but applications in satellites and integrated optics, because the Ge substrate constitutes a large portion of this cost. Additionally, group III-V and II-VI semiconductor based solar cells can not be easily integrated with Si-based CMOS and glass panel TFT-LCD and LTPS process. Furthermore, there are issues of heavy metal pollutions in fabricating group III-V and II-VI semiconductor based solar cells. Although a-Si thin-film solar cells have low cost, they have low efficiency and instability. Therefore, silicon wafer based solar cells are dominant in the solar cell market.

Solar cells operate as energy conversion devices, and are therefore subject to the Carnot Limit of conversion efficiency, which is about 85%. So far, the highest conversion efficiency of which market available solar cells have achieved is about 33%. Therefore, there are rooms for the improvement of the efficiency of the solar cells.

Theoretically, photons with an energy below the band gap of the absorber material cannot generate a hole-electron pair, and so their energy is not converted to useful output and only generates heat if absorbed. For photons with an energy above the band gap energy, only a fraction of the energy above the band gap can be converted to useful output. When a photon of greater energy is absorbed, the excess energy above the band gap is converted to kinetic energy of the carrier combination. The excess kinetic energy is converted to heat through phonon interactions as the kinetic energy of the carriers slows to equilibrium velocity. The solar frequency spectrum approximates a black body spectrum at about 6000 K, and as such, much of the solar radiation reaching the Earth is composed of photons with energies greater than the band gap of silicon. These higher energy photons will be absorbed by the solar cell, but the difference in energy between these photons and the silicon band gap is converted into heat via lattice vibrations (phonons) rather than into usable electrical energy. For single junction (single band gap) solar cells, the highest conversion efficiency in theory is about 28%. However, the average conversion efficiency for monocrystalline silicon and poly-Si solar cells in the market is only about 15%, because of the intrinsic limitations of materials that are unable to absorb all incident photons with energy greater than the band gap, and of the free-carrier absorption of the materials that limit the 100% conversion of the photon absorption into electron-hole pairs.

For multi-junction (or multi-band gap) solar cells, which is a stack (tandem) of individual single-junction solar cells in descending order of band gap, the top cell captures the high-energy photons and passes the rest of the photons on to be absorbed by lower band gap cells. The use of multi-band gaps (or multi-junctions) can reduce the intra-band energy relation so as to reduce the probability of generating phonons, thereby reducing heat generation and improving the photovoltaic conversion efficiency, comparing to the single junction (single band gap) solar cells. However, the tandem solar cells have issues of junction loss and lattice mismatch.

Therefore, a heretofore unaddressed need exists in the art to address the aforementioned deficiencies and inadequacies.

SUMMARY OF THE INVENTION

Recently, attention has been drawn to quantum-dot solar cells, the third generation solar cells, because of the high photovoltaic efficiency and the wavelength tuneability of light absorption of nanostructures. For a solar cell using silicon, one of indirect band gap semiconductors, quantum confinement effect has to be created by a nanostructure. To obtain this quantum confinement effect, crystalline or a-Si nanostructures that are less than 5 nm such as quantum well, quantum wire, and quantum dot have to be produced using materials with larger energy gap than that of a bulk silicon as a matrix or a barrier. It is known that the wavelength of the light moves to shorter wavelength as the size of the nanostructure gets smaller. Among these nanostructures, quantum dot structure has an advantage of high quantum efficiency.

For a silicon quantum dot solar cell, the silicon quantum dots are typically embedded in a dielectric matrix, such as silicon oxide ($SiO_x$), $SiN_y$, $SiC_z$, etc. The silicon quantum dots can provide a wide multi-band gap (about 4.1 eV to 1.2 eV) structure.

The present invention, in one aspect, relates to a photovoltaic cell or solar cell. In one embodiment, the photovoltaic cell includes a first conductive layer, an N-doped semiconductor layer formed on the first conductive layer, a first silicon layer formed on the N-doped semiconductor layer, a nanocrystalline silicon (nc-Si) layer formed on the first silicon layer, a second silicon layer formed on the nc-Si layer, a P-doped semiconductor layer on the second silicon layer, and a second conductive layer formed on the P-doped semiconductor layer.

In one embodiment, one of the first silicon layer and the second silicon layer is formed of amorphous silicon (a-Si), and the other of the first silicon layer and the second silicon layer formed of polycrystalline silicon (poly-Si). The N-doped semiconductor layer is formed of N-doped silicon, and where the P-doped semiconductor layer is formed of P-doped silicon.

The nc-Si layer has a plurality of silicon nanocrystals sized in a range of about 1-20 nm.

At least one of the first and second conductive layers is formed of a transparent conductive material. The transparent conductive material includes indium tin oxide (ITO), indium zinc oxide (IZO), aluminum zinc oxide (AZO), hafnium oxide (HfO), or a combination of them.

In another aspect, the present invention relates to a method for fabricating a photovoltaic cell. In one embodiment, the method includes the steps of providing a substrate, forming a first conductive layer on the substrate, forming an N-doped semiconductor layer on the first conductive layer, forming a first silicon layer on the N-doped semiconductor layer, forming an nc-Si layer on the first silicon layer, forming a second silicon layer on the nc-Si layer, forming a P-doped semiconductor layer on the second silicon layer, and forming a second conductive layer on the P-doped semiconductor layer.

In one embodiment, the step of forming the nc-Si layer comprises the steps of forming a silicon-rich (Si-rich) dielectric layer on the first silicon layer, and laser-annealing the Si-rich dielectric layer to form a plurality of silicon nanocrystals therein.

In one embodiment, the N-doped semiconductor layer is formed of N-doped silicon, and where the P-doped semiconductor layer is formed of P-doped silicon. The nc-Si layer has a plurality of silicon nanocrystals sized in a range of about 1-20 nm. One of the first silicon layer and the second silicon layer is formed of a-Si, and the other of the first silicon layer and the second silicon layer formed of poly-Si.

At least one of the first and second conductive layers is formed of a transparent conductive material. The transparent conductive material includes ITO, IZO, AZO, HfO, or a combination of them.

In yet another aspect, the present invention relates to a photovoltaic cell. In one embodiment, the photovoltaic cell has a first conductive layer, a second conductive layer, and a photovoltaic conversion layer formed between the first conductive layer and the second conductive layer, where the photovoltaic conversion layer has a multi-band gap. At least one of the first and second conductive layers is formed of a transparent conductive material. In one embodiment, the photovoltaic cell further has an N-doped semiconductor layer formed between the first conductive layer and the photovoltaic conversion layer, and a P-doped semiconductor layer formed between the second conductive layer and the photovoltaic conversion layer.

In one embodiment, the photovoltaic conversion layer includes an a-Si layer, a poly-Si layer, and a Si-rich dielectric layer formed between the a-Si layer and the poly-Si layer. The Si-rich dielectric layer is formed of a material comprising Si-rich oxide, Si-rich nitride, Si-rich oxy-nitride, Si-rich carbide, or a combination of them. The Si-rich dielectric layer comprises an nc-Si layer having a plurality of silicon nanocrystals sized in a range of about 1-20 nm.

In another embodiment, the photovoltaic conversion layer includes a first Si-rich dielectric sub-layer having a refractive index, n1, formed on the first conductive layer, and a second Si-rich dielectric sub-layer having a refractive index, n2, formed on the first Si-rich dielectric sub-layer, wherein n2<n1. In one embodiment, the photovoltaic conversion layer may further include a third Si-rich dielectric sub-layer having a refractive index, n3, formed between the second Si-rich dielectric sub-layer and the second conductive layer, wherein n3<n2<n1. Each of the first Si-rich dielectric sub-layer, the second Si-rich dielectric sub-layer and the third Si-rich dielectric sub-layer is formed of a material comprising Si-rich oxide, Si-rich nitride, Si-rich oxy-nitride, Si-rich carbide, or a combination of them. In another embodiment, the photovoltaic conversion layer also includes an a-Si layer, and a poly-Si layer, where the first silicon-rich dielectric sub-layer and the second silicon-rich dielectric sub-layer are formed between the a-Si layer and the poly-Si layer.

In a further aspect, the present invention relates to a method for fabricating a photovoltaic cell. In one embodiment, the method includes the steps of providing a substrate, forming a first conductive layer on the substrate, forming a photovoltaic conversion layer formed on the first conductive layer, wherein the photovoltaic conversion layer has a multi-band gap, and forming a second conductive layer on the photovoltaic conversion layer.

Additionally, the method may also includes the steps of forming an N-doped semiconductor layer formed between the first conductive layer and the photovoltaic conversion layer, and forming a P-doped semiconductor layer formed between the second conductive layer and the photovoltaic conversion layer.

In one embodiment, the step of forming the photovoltaic conversion layer comprises the steps of forming a first silicon layer on the first conductive layer, forming a Si-rich dielectric layer on the first silicon layer, and forming a second silicon layer on the silicon-rich dielectric layer, where one of the first silicon layer and the second silicon layer comprises an a-Si layer, and the other of the first silicon layer and the second silicon layer comprises a poly-Si layer. The step of forming the Si-rich dielectric layer further includes the steps of laser-annealing the Si-rich dielectric layer to form a plurality of silicon nanocrystals therein.

In another embodiment, the step of forming the photovoltaic conversion layer comprises the steps of forming a first Si-rich dielectric sub-layer having a refractive index, n1, on the first conductive layer; and forming a second Si-rich dielectric sub-layer having a refractive index, n2, on the first Si-rich dielectric sub-layer, wherein n2<n1. In one embodiment, the step of forming the photovoltaic conversion layer further comprises the step of forming a third Si-rich dielectric sub-layer having a refractive index, n3, between the second Si-rich dielectric sub-layer and the second conductive layer, wherein n3<n2<n1.

In yet a further aspect, the present invention relates to an LCD panel operably drivable by an LCD driver and illuminatable by a backlight. In one embodiment, the LCD panel has a display area for displaying information of interest, and a photovoltaic cell positioned in an area surrounding the display area and exposed to a light and adapted for converting the optical energy of the light into an electrical energy that is supplied to the LCD driver as a driving power. The photovoltaic cell comprises a first conductive layer, a second conductive layer, and a photovoltaic conversion layer formed between the first conductive layer and the second conductive layer, wherein the photovoltaic conversion layer has a multi-band gap. In one embodiment, the display area has a plurality of low temperature polycrystalline silicon thin film transistors (LTPS-TFTs).

In one embodiment, the photovoltaic conversion layer includes an a-Si layer, a poly-Si layer, and a silicon-rich dielectric layer formed between the a-Si layer and the poly-Si layer. The Si-rich dielectric layer is formed of a material comprising Si-rich oxide, Si-rich nitride, Si-rich oxy-nitride, Si-rich carbide, or a combination of them. In one embodiment, the Si-rich dielectric layer comprises an nc-Si layer having a plurality of silicon nanocrystals sized in a range of about 1-20 nm.

In another embodiment, the photovoltaic conversion layer comprises a first silicon-rich (Si-rich) dielectric sub-layer having a refractive index, n1, formed on the first conductive layer, and a second Si-rich dielectric sub-layer having a refractive index, n2, formed on the first Si-rich dielectric sub-layer, wherein n2<n1. The photovoltaic conversion layer may further have a third Si-rich dielectric sub-layer having a refractive index, n3, formed between the second Si-rich dielectric sub-layer and the second conductive layer, wherein n3<n2<n1.

In one aspect, the present invention relates to a method for fabricating an LCD panel operably drivable by an LCD driver and illuminatable by a backlight. In one embodiment, the method includes the steps of providing a substrate, forming a display area on the substrate, and forming a photovoltaic cell on the substrate in an area surrounding the display area and exposed to a light such that when receiving the optical energy of the light, the photovoltaic cell converts the optical energy into an electrical energy that is supplied to the LCD driver as a driving power. The step of forming the photovoltaic cell comprises the steps of forming a first conductive layer, forming a second conductive layer, and forming a photovoltaic conversion layer between the first conductive layer and the second conductive layer, wherein the photovoltaic conversion layer has a multi-band gap.

In one embodiment, the step of forming the photovoltaic conversion layer comprises the steps of forming a first silicon layer on the first conductive layer, forming a Si-rich dielectric layer on the first silicon layer, and forming a second silicon layer on the laser-annealed Si-rich dielectric layer, where one of the first silicon layer and the second silicon layer comprises an a-Si layer, and the other of the first silicon layer and the second silicon layer comprises a poly-Si layer. In one embodiment, the step of forming the Si-rich dielectric layer further the step of laser-annealing the Si-rich dielectric layer to form a plurality of silicon nanocrystals therein.

In another embodiment, the step of forming the photovoltaic conversion layer comprises the steps of forming a first Si-rich dielectric sub-layer having a refractive index, n1, on the first conductive layer and forming a second Si-rich dielectric sub-layer having a refractive index, n2, on the first Si-rich dielectric sub-layer, wherein n2<n1. Additionally, the step of forming the photovoltaic conversion layer may further have the step of forming a third Si-rich dielectric sub-layer having a refractive index, n3, between the second Si-rich dielectric sub-layer and the second conductive sub-layer, wherein n3<n2<n1.

In another aspect, the present invention relates to a display panel having a plurality of pixels arranged in the form of matrix. Each pixel includes an active area for displaying information of interest, a switch area having one or more switch elements, and a photovoltaic cell formed between the active area and the switch area, wherein the photovoltaic cell has a photovoltaic conversion layer with a multi-band gap.

In one embodiment, the photovoltaic conversion layer comprises an a-Si layer, a poly-Si layer, and a silicon-rich dielectric layer formed between the a-Si layer and the poly-Si layer. The silicon-rich dielectric layer comprises an nc-Si layer having a plurality of silicon nanocrystals sized in a range of about 1-20 nm.

In yet another aspect, the present invention relates to a method for fabricating display panel. In one embodiment, the method includes the steps of providing a substrate, and forming a plurality of pixels in the form of matrix on the substrate, each pixel comprising a photovoltaic cell, where the photovoltaic cell has a photovoltaic conversion layer with a multi-band gap.

In one embodiment, the step of forming the plurality of pixels comprises the steps of (a) forming a plurality of gate electrodes electrically coupled to gate lines on the substrate, where the plurality of gate electrodes is spatially apart from one another, and where each pair of adjacent gate electrodes defines an active area, a switching area in which the gate electrodes are formed and a photovoltaic cell area therebetween, (b) forming a gate insulating layer on the plurality of gate electrodes and the remaining area of the substrate, (c) forming an a-Si layer on the gate insulating layer over each of the plurality of gate electrodes in each switch area, (d) forming a doped a-Si layer on the a-Si layer, (e) forming a first conductive layer on the doped a-Si layer and the remaining area of the gate insulating layer, (f) depositing a Si-rich dielectric layer on the first conductive layer over each photovoltaic cell area, (g) forming a source electrode and a drain electrode in each switch area, thereby forming an array of TFTs on the substrate, (h) forming a passivation layer on the first conductive layer over the array of TFTs and the Si-rich dielectric layer, (i) via contacts and on the passivation layer in the switch area and the photovoltaic cell area, and (j) forming a second conductive layer having a first portion on an area between the switch area and the photovoltaic cell area such that the first portion is in contact with the drain electrode of the TFT in each switch area through the via, and a second portion on the Si-rich dielectric layer in the photovoltaic cell area.

The step of forming the plurality of pixels further includes the step of laser-annealing the Si-rich dielectric layer to form a plurality of silicon nanocrystals therein.

In one embodiment, the gate insulating layer is formed of silicon oxide, silicon nitride, or silicon oxynitride. The doped a-Si layer comprises n+ doped a-Si or p+ doped a-Si. The passivation layer is formed of a dielectric material including silicon oxide or silicon nitride. At least one of the first and second conductive layers is transparent. In one embodiment, the second conductive layer is formed of ITO, IZO, AZO, HfO, or a combination of them.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein:

FIG. 3 shows the characterization of the laser-induced silicon nanocrystals: (A) a TEM image showing sizes of the silicon nanocrystals, and (B) a distribution of the nanocrystal sizes in the laser-induced silicon nanocrystals;

FIGS. 14A-14F show schematically a process of fabricating an LTPS-TFT panel integrating with a plurality of Si-nanocrystal photovoltaic cells according to one embodiment of the present invention.

DETAILED DESCRIPTION OF THE INVENTION

Figure 1:
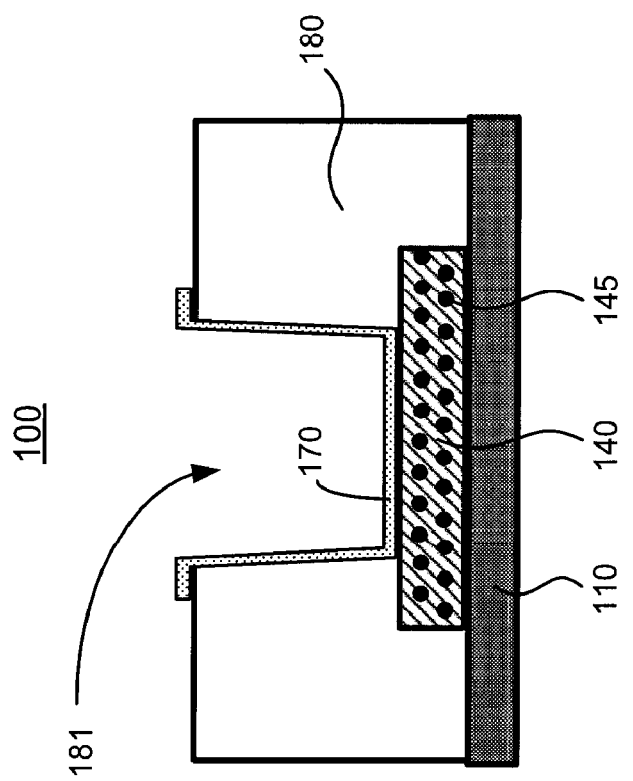
FIG. 1 shows schematically a cross-sectional view of a photovoltaic cell according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Additionally, some terms used in this specification are more specifically defined below.

As used herein, "about" or "approximately" shall generally mean within 20 percent, preferably within 10 percent, and more preferably within 5 percent of a given value or range. Numerical quantities given herein are approximate, meaning that the term "about" or "approximately" can be inferred if not expressly stated.

As used herein, the term "solar cell" and "photovoltaic cell" are synonyms in the specification and refers to is a device that converts solar/optical energy into electricity by the photovoltaic effect.

Short names and/or abbreviations used herein, "nc-Si" refers to nanocrystalline silicon, "a-Si" refers to amorphous silicon, "poly-Si" refers to polycrystalline silicon, "Si-rich" refers to silicon rich, "LTPS" refers to low temperature polycrystalline silicon, "TFT" refers to thin film transistor, "PECVD" refers to plasma enhancement chemical vapor deposition, "ELA" refers to excimer laser annealing, "CLC" refers to continuous-wave laser crystallization.

The description will be made as to the embodiments of the present invention in conjunction with the accompanying drawings in FIGS. 1-14. In accordance with the purposes of this invention, as embodied and broadly described herein, this invention, in one aspect, relates to a photovoltaic cell of Si-nanocryatals with muli-band gap and applications in an LTPS-TFT panel.

Referring to FIG. 1, a photovoltaic cell 100 is schematically shown according to one embodiment of the present invention. In this exemplary embodiment, the photovoltaic cell 100 has a first conductive layer 110, a Si-rich dielectric layer 140 formed on the first conductive layer 110, and a second conductive layer 170 formed on the Si-rich dielectric layer 140. The Si-rich dielectric layer 140 can be deposited by the PECVD. In the Si-rich dielectric deposition process, the ratio of $SiH_4$ and $N_2O$ (or NH3, or N2) gases is adjusted so that a desirable range of refractive index, which indicates level of Si richness in such films is obtained. By proper laser-annealing, the excess of silicon atoms in the Si-rich dielectric layer 140 are segregated, clustered, and turned into silicon nanocrystals. The Si-rich dielectric layer with different refractive indexes (1.6-3.7), different thickness (50-500 nm), and different sizes (1-20 nm) of silicon nanocrystals 145 are made. Due to the variations of melting temperature of different semiconductor materials and their energy absorption efficiency levels, a plurality of laser-induced silicon nanocrystals can also be formed by laser crystallizing polycrystalline silicon or amorphous silicon films. Therefore, the laser crystallization process constructs a multi-bandgap light absorption structure, which makes the photovoltaic cell 100 be capable of absorbing light having wavelengths over a range of about 300-1000 nm.

The Si-rich dielectric layer 140 is formed of Si-rich oxide ($SiO_x$), Si-rich nitride ($SiN_y$), Si-rich oxy-nitride ($SiO_xN_y$), Si-rich carbide ($SiC_z$), or a combination of them, wherein $0<x<2$, $0<y<1.34$, and $0<z<1$. The silicon rich dielectric layer 140 can be formed as a single layer or a multi-layer structure. Either way, it contains at least one of the silicon-rich oxide film, the silicon-rich nitride film, and the silicon-rich oxy-nitride film.

The first conductive layer 110 and the second conductive layer 170 may be formed with metal, metal oxide, or any combinations of these materials. The metal may be reflective materials comprise aluminum, copper, silver, gold, titanium, molybdenum, lithium, tantalum, neodymium, tungsten, alloy, others, or any combinations of these metals. The metal oxide may be transparent conductive materials comprise ITO, IZO, AZO, HfO, or the like. The metal may be a combination of the reflective materials and the transparent conductive materials. In practice, at least one of the first conductive layer and the second conductive layer is made of a transparent conductive material, such as ITO, IZO, AZO, HfO, or the like. The transparent conductive layer allows for ambient light to penetrate and reach the Si-rich dielectric layer (photo-sensing region).

In practice, a layer 180 of UHA is formed on the Si-rich dielectric layer 140. Then, a patterning/masking process is applied to the layer 180 to define a via or contact hole 181 therein. The second conductive layer 170 is formed on the Si-rich dielectric layer 140 through the via or contact hole 181.

The multi-band gap Si nanocrystal photovoltaic cell with a single junction has numbers of advantages over a conventional multiple junction (tandem) photovoltaic cell having a stack of individual single-junction photovoltaic cells in descending order of bandgap. In the multiple junction cell device, the top cell captures the high-energy photons and passes the rest of the photons on to be absorbed by lower-bandgap cell. However, the tandem photovoltaic cells has drawbacks including junction loss and lattice mismatch, thereby reducing the photovoltaic conversion efficiency. Photovoltaic cells with multiple band gap absorber materials are able to more efficiently convert the solar spectrum. By using multiple band gaps, the solar spectrum may be broken down into smaller bins where the thermodynamic efficiency limit is higher for each bin.

Figure 2:
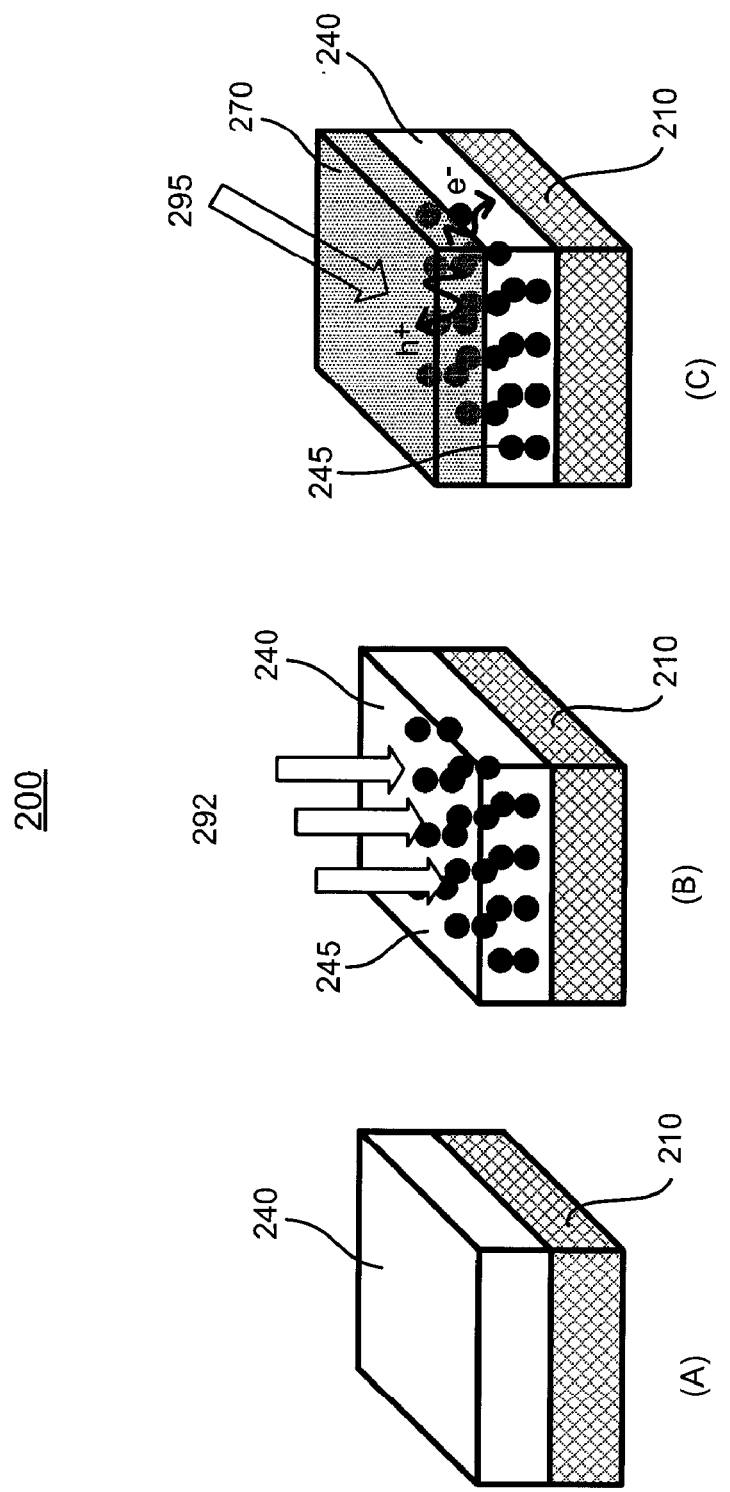
FIG. 2 shows schematically a process of fabricating a photovoltaic cell having a Si-rich dielectric layer with a plurality of laser-induced silicon nanocrystals according to one embodiment of the present invention: (A) forming a Si-rich dielectric layer on a first conductive layer, (B) laser-annealing the Si-rich dielectric layer to form a plurality of silicon nanocrystals, and (C) forming a second conductive layer on the Si-rich dielectric layer.

FIG. 2 shows schematically a process of fabricating a photovoltaic cell 200 according to one embodiment of the present invention. At first, as shown in FIG. 2A, a Si-rich dielectric layer 240 is formed on a first conductive layer 210. Next, the Si-rich dielectric layer 240 is exposed to a beam of laser 292 to form a plurality of silicon nanocrystals 245 therein, as shown in FIG. 2B. Then, a second conductive layer 270 is formed on the Si-rich dielectric layer 240, as shown in FIG. 2C.

The Si-rich dielectric layer 240 can be formed on the first conductive layer 210 with a PECVD process, at a low pressure of about 1 torr, at a temperature below about 400° C. In one embodiment, the Si-rich dielectric layer 240 is formed at a temperature range of about 200° C. to about 400° C., or about 350° C. to about 400° C., preferably at a temperature of about 370° C. For the given temperature range, it takes about from 13 seconds to 250 seconds, preferably about 25 seconds to about 125 seconds, to form a Si-rich dielectric layer 240 in a desirable thickness of about 50 nm to about 1000 nm. During the process of forming the Si-rich dielectric layer 240, the refractive index of the Si-rich dielectric layer 240 is controlled through adjusting the silicon content ratio $SiH_4/N_2O$. In one embodiment, the silicon content ratio $SiH_4/N_2O$ is adjusted in the range of about 1:10 to about 10:1, resulting in a refractive index at least in the range of about 1.47 to about 3.7, the silicon content ratio is preferably in the range of about 1:5 to about 10:1, resulting in a refractive index at least in the range of about 1.7 to about 3.7. The Si-rich dielectric layer 240 can also be formed with other methods or processes.

The laser annealing the Si-rich dielectric layer 240 can be done, for example by using excimer laser annealing (ELA). An excimer laser with an adjustable frequency and an adjustable laser power density at a temperature below 400° C. can be utilized. In one embodiment, the ELA is performed at a pressure of about 1 atm (760 torr), or about 1×e-3 Pa, and at a temperature below about 400° C. In another embodiment, the ELA is performed at a room temperature, i.e. about 20-25° C. Other types of laser annealing with corresponding parameters may also be utilized to practice the present invention.

The laser wavelength and the laser power level are adjustable to yield desirable diameters of the laser-induced silicon nanocrystals. The laser wavelength is in a range of about 266-1024 nm for any laser types such as, for examples, ELA, continuous-wave laser crystallization (CLC), solid-state CW green laser, or the like. The desirable diameters of the laser-induced silicon nanocrystals are in the range of about 1-20 nm, preferably in the range of about 3-6 nm. In one embodiment, the ELA of the Si-rich dielectric layer 240 is performed at a wavelength in the range of about 266-532 nm, preferably about 308 nm. The ELA of the Si-rich dielectric layer 240 is typically performed at a laser power density range of about 70-440 $mJ/cm^2$, preferably at a laser power density range of about 70-200 $mJ/cm^2$. In other embodiment, the CLC of the Si-rich dielectric layer 240 is performed at a wavelength in the range of, for example, about 532-1024 nm. In another embodiment, the solid-state CW green laser of the Si-rich dielectric layer 240 is performed at a wavelength of, for example, about 532 nm. However, when the laser power density exceeds about 200 $mJ/cm^2$, the first conductive layer under the Si-rich dielectric layer 240 may be damaged, or peeled. In order to produce the Si-rich dielectric layer 240 with larger laser-induced silicon nanocrystals in the range of about 4 nm to about 10 nm, the excimer laser annealing of the Si-rich dielectric layer 240 is preferably performed at a laser power density range of about 200-440 $mJ/cm^2$. On the other hand, in order to produce a Si-rich dielectric layer with smaller laser-induced silicon nanocrystals in the range of about 2 to about 6 nm, the ELA of the Si-rich dielectric layer 240 is preferably performed at a laser power density range of about 70-200 $mJ/cm^2$. The density of the laser-induced silicon nanocrystals 245 in the Si-rich dielectric layer 240 is preferably in the range of about $1\times10^{11}/cm^2$ to about $1\times10^{12}/cm^2$.

FIG. 3 shows the characterization of the laser-induced silicon nanocrystals: (A) a TEM image showing sizes of the silicon nanocrystals, and (B) a distribution of the nanocrystal sizes in the laser-induced silicon nanocrystals with peak population at a diameter of about 4 nm.

Referring back to FIG. 2C, in this embodiment, the second conductive layer 270 is transparent. When an incident beam of light 295 passes through the transparent layer 270 and reaches the Si-rich dielectric layer 240 having the plurality of laser-induced silicon nanocrystals 245, photons of the beam with energy equal to or greater than the multi-band gap of the Si-rich dielectric layer 240 are absorbed. Accordingly, hole ($h^+$) and electron ($e^-$) pairs are generated within the Si-rich dielectric layer 240. The generated holes ($h^+$) and electrons ($e^-$) move towards and through the second conductive layer 270 and the first conductive layer 210, respectively. If a load is connected between the first conductive layer 210 and the second conductive layer 270, there will be a current flowing through the load. That is the photon energy of the incident light 295 is converted into electrical energy by the photovoltaic cell 200.

Additionally, the first conductive layer 210 can also be made of a transparent conductive material.

The steps set forth above are not necessarily to be performed in sequence. Neither the process is the only way to practice the present invention.

For example, a photovoltaic cell can be fabricated by providing a substrate, forming a first conductive on the substrate, forming a Si-rich dielectric layer on the first conductive layer, and forming a second conductive layer on the Si-rich dielectric layer. Then, laser annealing the Si-rich dielectric layer is performed to form a plurality of silicon nanocrystals. In one embodiment, the laser annealing is performed by directing a laser beam from the top of the second conductive layer to the Si-rich dielectric layer. In another embodiment, the substrate and the first conductive layer are made of transparent conductive material such that the laser annealing is performed by directing a laser beam from the bottom of the substrate to the Si-rich dielectric layer. In an alternative embodiment, the laser annealing is performed directing two laser beams from both the top and bottom of the photovoltaic cell to the silicon-rich dielectric layer, respectively.

Figure 4:
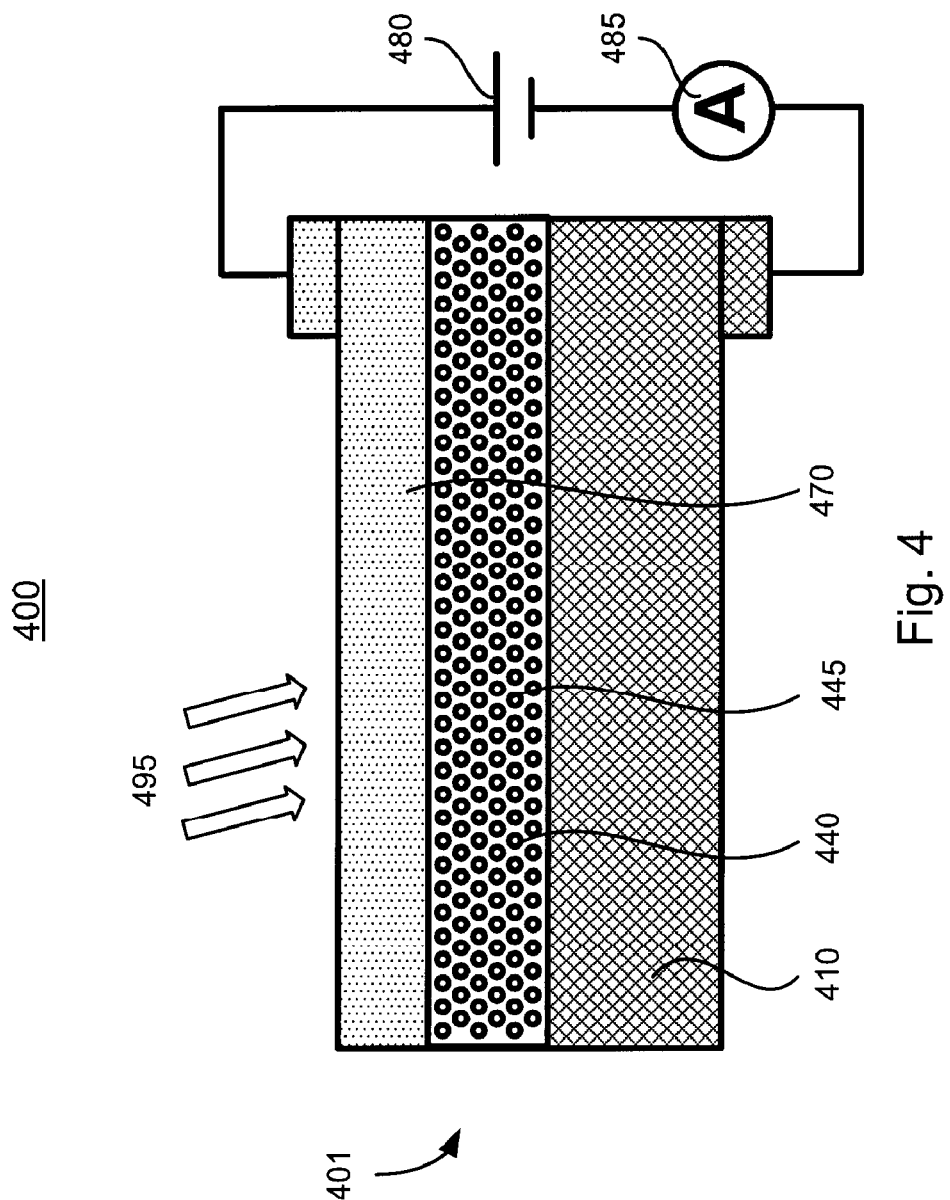
FIG. 4 shows schematically a sectional view of a photovoltaic cell according to one embodiment of the present invention.

Referring to FIG. 4, a photovoltaic cell battery 400 is shown according to one embodiment of the present invention. The photovoltaic cell battery 400 includes a photovoltaic cell 401 for converting photon energy of light 495 incident to the photovoltaic cell 401 into electrical energy. The photovoltaic cell 401 has a first conductive layer 410, a second conductive layer 470 and a Si-rich dielectric layer 440 formed between the first conductive layer 410 and the second conductive layer 470. The Si-rich dielectric layer 440 has a plurality of laser-induced silicon nanocrystals 445 with a multi-band gap. Furthermore, the photovoltaic cell battery 400 also includes a rechargeable battery 480 electrically coupled between the first conductive layer 410 and the second conductive layer 470 for storing the electrical energy therein. Additionally, a current meter 485 may be connected between the photovoltaic cell 401 and the rechargeable battery 480. The photovoltaic cell 401 can be fabricated by the process as disclosed above.

Additionally, the arrangement as shown in FIG. 4 can also be utilized as a photo detector, if the rechargeable battery 480 is replaced with a load, for example, a resistor.

Figure 5:
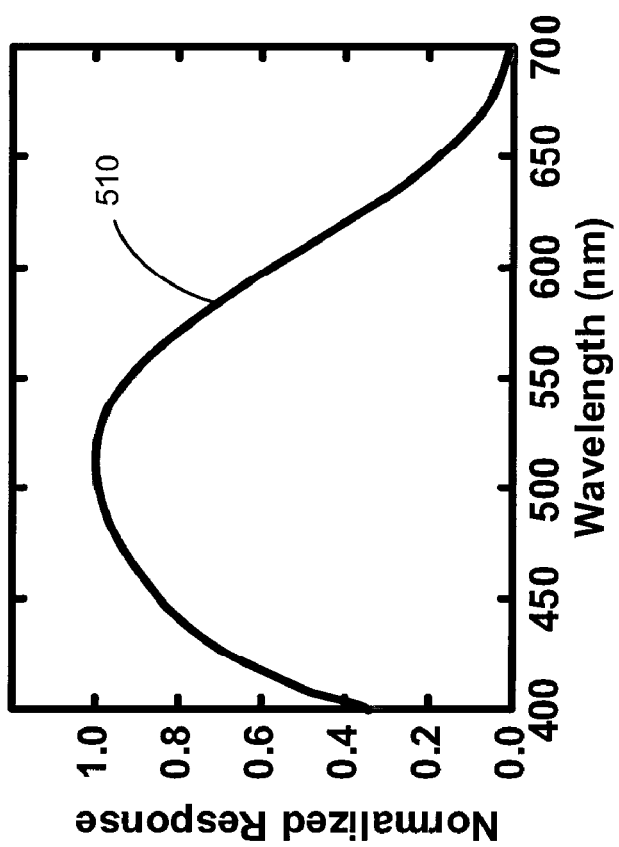
FIG. 5 shows a photo-current response of the photovoltaic cell to an incident white light.

Referring to FIG. 5, curve 510 is a spectrum response of the photovoltaic cell having a Si-nanocrystal SiOx photovoltaic conversion (photosensitive) layer to an incident beam of white light, for example, sunlight. The white photo-response characteristics (400-650 nm) of the photovoltaic cell is due to the multi-band gap of the Si-nanocrystals of the photovoltaic cell.

Figure 6:
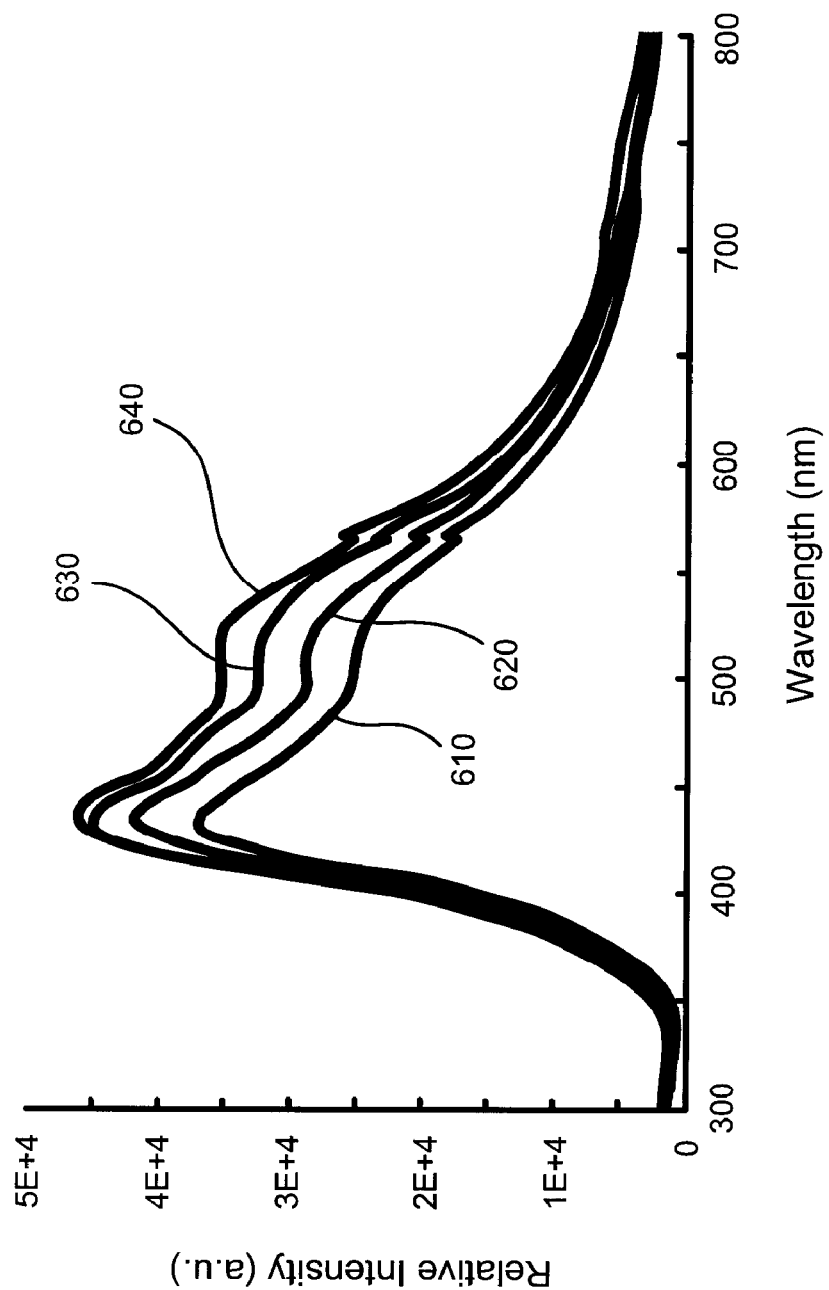
FIG. 6 shows photoluminescence response of the photovoltaic cell to an incident white light by different power density of laser annealing on Si-rich SiOx layer.

FIG. 6 shows photoluminescence response of a photovoltaic cell to an incident white light by different power density of laser annealing on Si-rich SiOx layer. Curves 610, 620, 630 and 640 are the photoluminescence response for the laser annealing energy 300 mJ/cm$^2$, 350 mJ/cm$^2$, 400 mJ/cm$^2$ and 440 mJ/cm$^2$, respectively.

Figure 7:
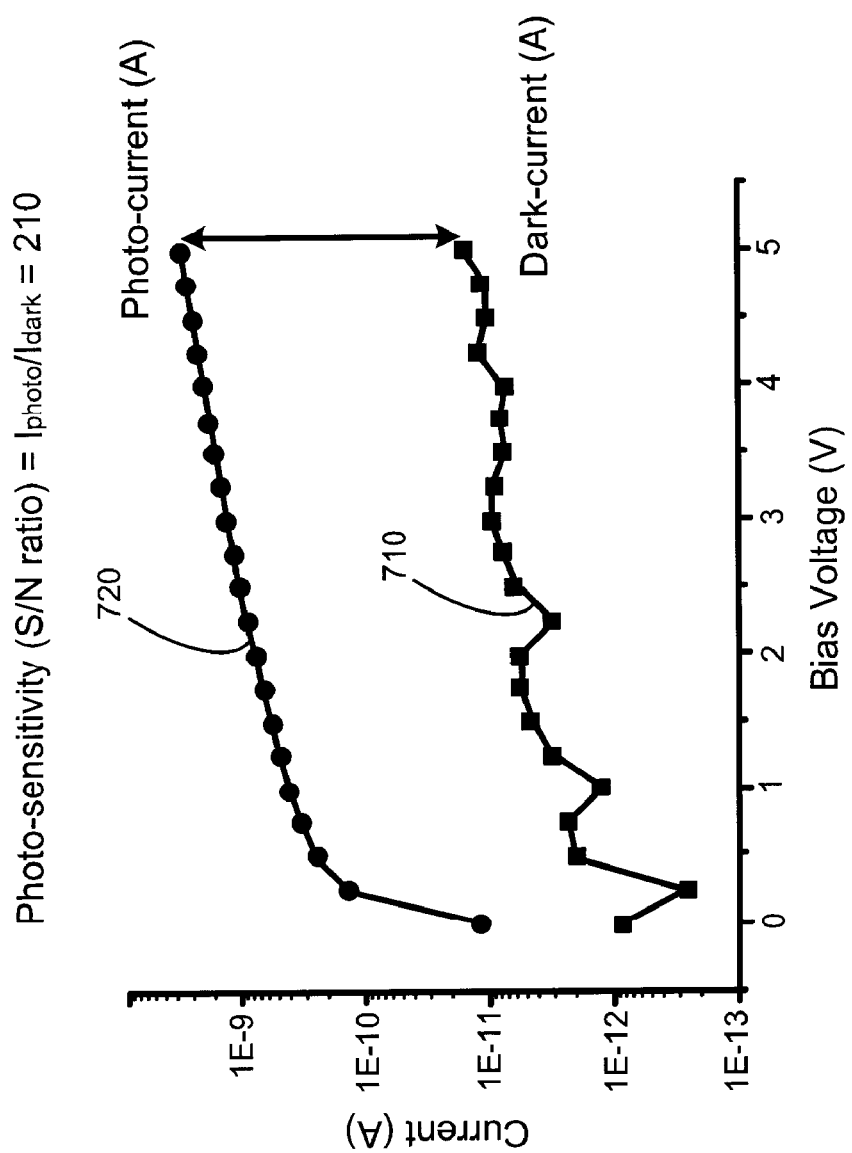
FIG. 7 shows current-voltage characteristics of a photovoltaic cell according to one embodiment of the present invention.

Referring to FIG. 7, the current-voltage characteristics of a photovoltaic cell is shown according to one embodiment of the present invention. Curves 710 and 720 are the dark-current and photo-current of the photovoltaic cell, respectively. The optical-electrical characteristics indicate that higher sensitivity and comparable dark current level to that of a traditional P-I-N (positive-intrinsic-negative) diode can be easily obtained in the invented photovoltaic cell.

Figure 8:
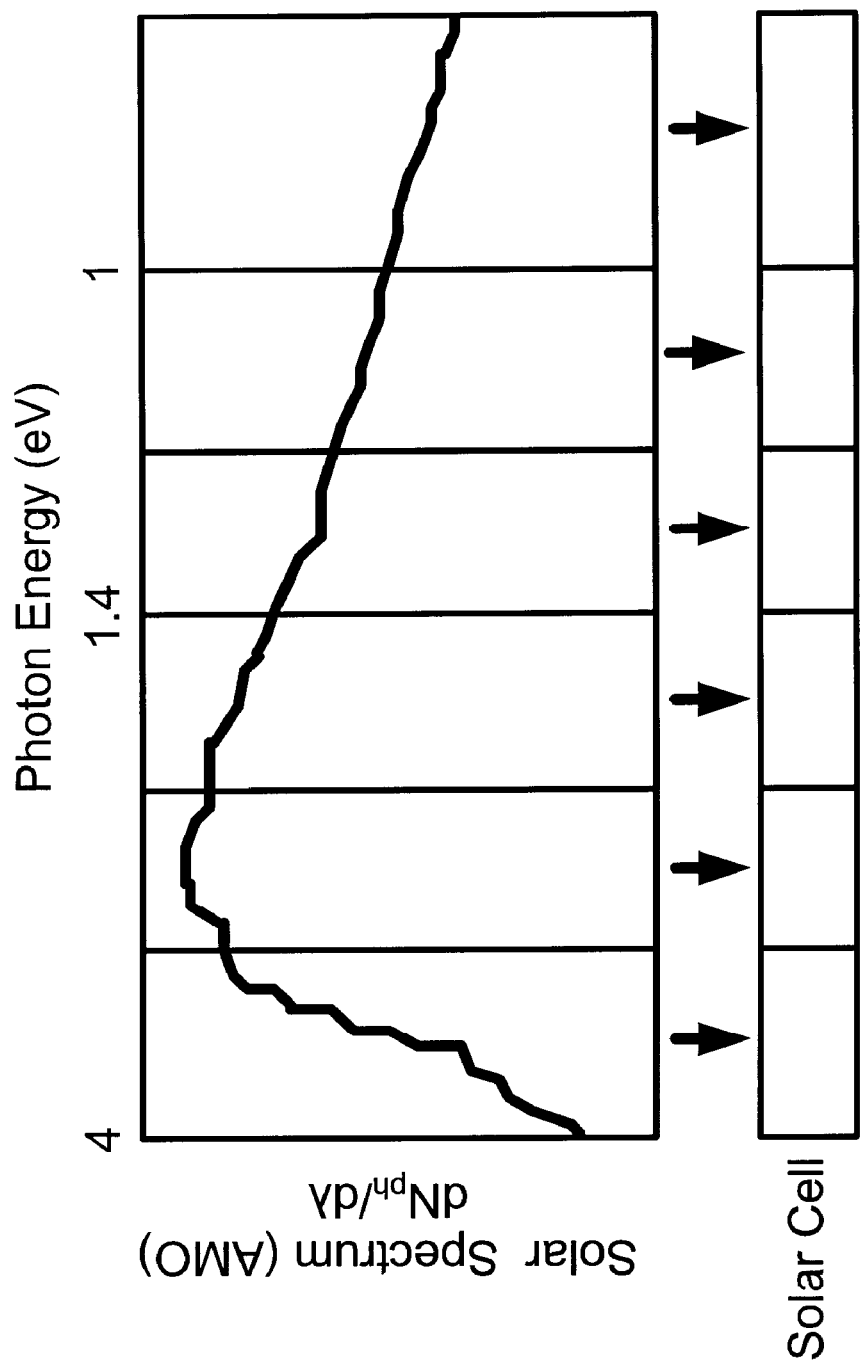
FIG. 8 shows schematically a spectral characteristics of a photovoltaic cell with a multi-band gap according to one embodiment of the present invention, where the multi-band gap is divided into a plurality of narrow regions.

FIG. 8 shows schematically a spectral characteristics of a photovoltaic cell with a multi-band gap according to one embodiment of the present invention. The multi-band gap is divided into a plurality of narrow regions, each corresponds to a range of wavelengths of light to be photovoltaically converted into electrical power.

Figure 9:
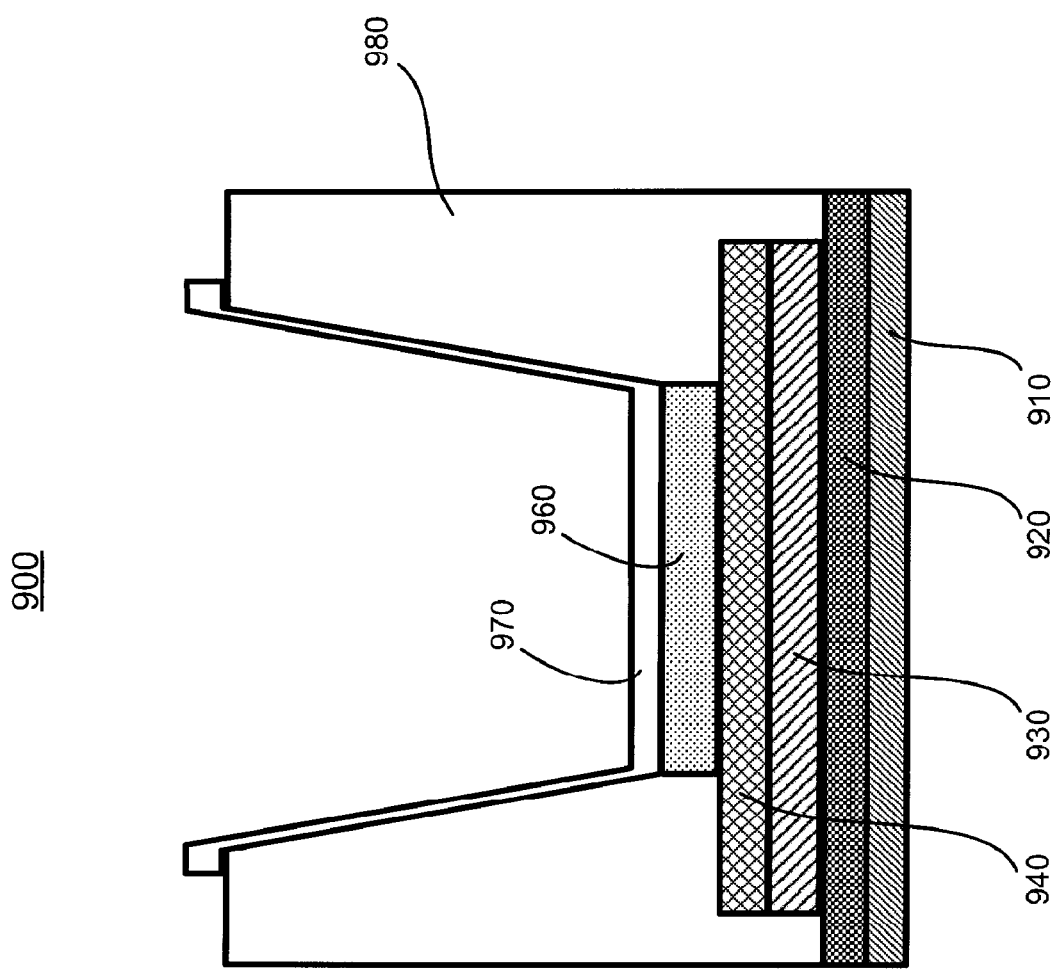
FIG. 9 shows schematically a cross-sectional view of a photovoltaic cell according to one embodiment of the present invention.

Referring to FIG. 9, a cross-sectional view of a photovoltaic cell 900 is shown according to one embodiment of the present invention. In one embodiment, the photovoltaic cell 900 has a first conductive layer 910, a first semiconductor layer 920 formed on the first conductive layer 910, a first Si-rich dielectric layer 930 formed on the first semiconductor layer 920, a second Si-rich dielectric layer 940 formed on the first Si-rich dielectric layer 930, and a second semiconductor layer 960 formed on the second Si-rich dielectric layer 940, and a second conductive layer 970 formed on the second semiconductor layer 960.

In one embodiment, one of the first semiconductor layer 920 and the second semiconductor layer 960 is an N-doped semiconductor layer, and the other of the first semiconductor layer 920 and the second semiconductor layer 960 is a P-doped semiconductor layer. For example, the first semiconductor layer 920 is an N-doped semiconductor layer, and the second semiconductor layer 960 is a P-doped semiconductor layer. The N-doped semiconductor layer comprises N-doped silicon, and the P-doped semiconductor layer comprises P-doped silicon. Other semiconductor material can also be utilized to practice the present invention. The N-doped semiconductor layer 920 and the P-doped semiconductor layer 960 can be formed with a standard process, such as an implantation process, a PECVD process.

In another embodiment, one of the first semiconductor layer 920 and the second semiconductor layer 960 is formed of a-Si, and the other of the first semiconductor layer 920 and the second semiconductor layer 960 is formed of poly-Si. For example, the first semiconductor layer 920 is formed of poly-Si, and the second semiconductor layer 960 is formed of a-Si. The first semiconductor layer 920 and the second semiconductor layer 960 may be formed of micro-crystallized silicon, mono-crystallized silicon, or any combinations of these materials. The laser crystallized N-type semiconductor and the laser crystallized P-type semiconductor are formed by a laser crystallization process.

The first Si-rich dielectric layer 930 has a refractive index, n1, and the second Si-rich dielectric layer 940 has a refractive index, n2, where n2<n1. At least one of the first Si-rich dielectric layer 930 and the second Si-rich dielectric layer 940 has a plurality of silicon nanocrystals with a multi-band gap. The plurality of silicon nanocrystals can be formed by a laser-annealing process as disclosed above or a CVD process. The first Si-rich dielectric layer 930 and the second Si-rich dielectric layer 940 can be formed of an identical material or substantially different materials, such as Si-rich oxide, Si-rich nitride, silicon-rich oxy-nitride, or the like. In one embodiment, the first Si-rich dielectric layer 930 and/or the second Si-rich dielectric layer 940 is an nc-Si layer having a multi-band gap.

The first conductive layer 910 and the second conductive layer 970 may be formed with metal, metal oxide, or any combinations of these materials. The metal may be reflective materials comprise aluminum, copper, silver, gold, titanium, molybdenum, lithium, tantalum, neodymium, tungsten, alloy, others, or any combinations of these metals. The metal oxide may be transparent conductive materials comprise ITO, IZO, AZO, HfO, or the like. The metal may be a combination of the reflective materials and the transparent conductive materials. In practice, at least one of the first conductive layer and the second conductive layer is made of a transparent conductive material, such as ITO, IZO, AZO, HfO, or the like. In this embodiment, the second conductive layer 970 is preferably a transparent conductive material layer made of a transparent conductive material.

Figure 10:
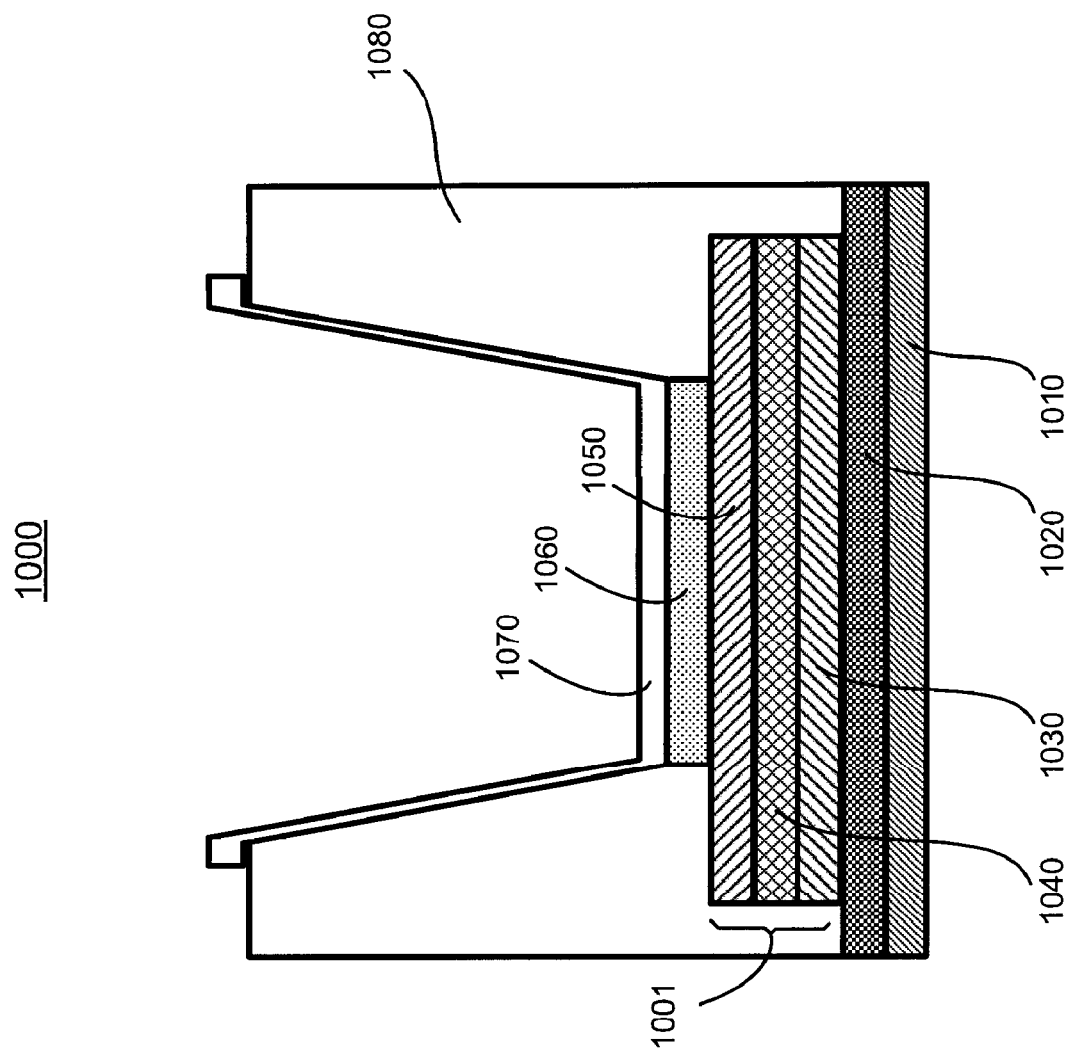
FIG. 10 shows schematically a cross-sectional view of a photovoltaic cell according to another embodiment of the present invention.
Figure 11:
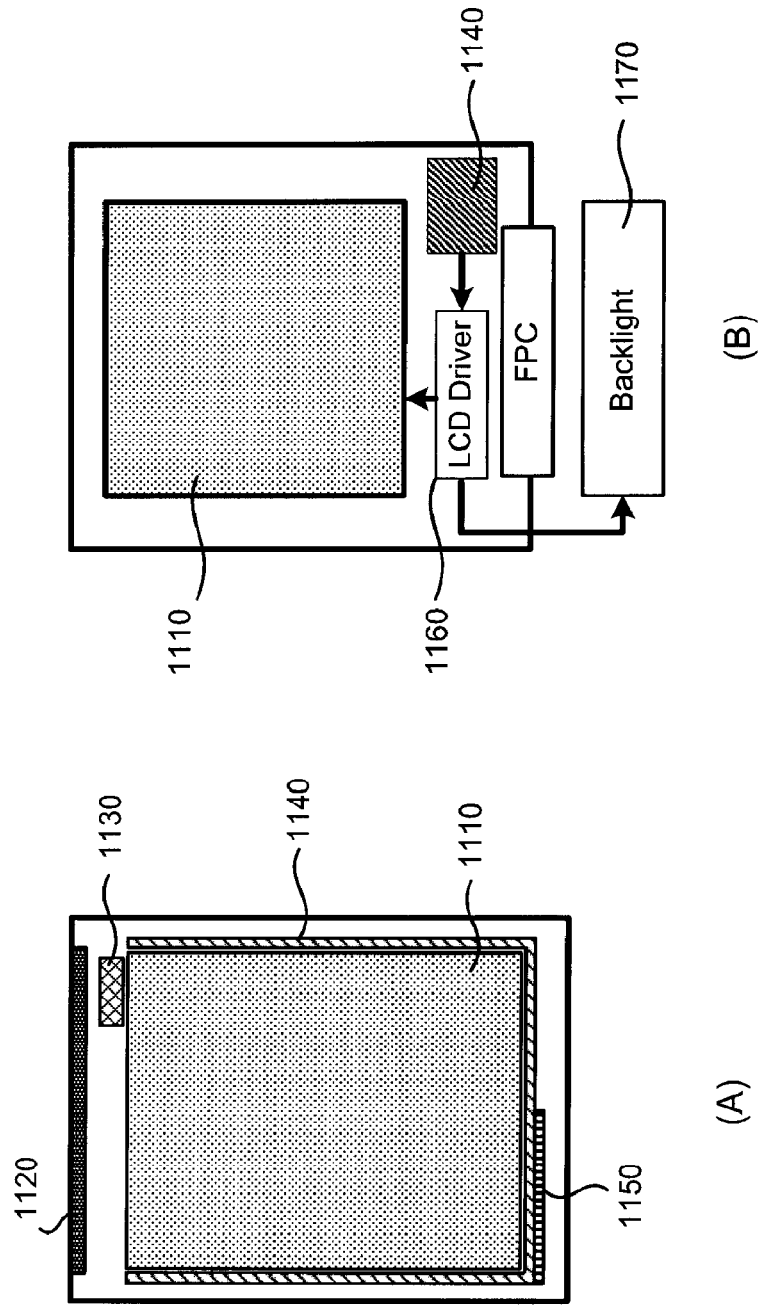
FIGS. 11A and 11B show schematically a display panel integrating with one or more Si-nanocrystal photovoltaic cells according to embodiments of the present invention.

FIG. 10 shows a photovoltaic cell 1000 according to one embodiment of the present invention. In one embodiment, the photovoltaic cell 1000 includes a first conductive layer 1010, an N-doped semiconductor layer 1020 formed on the first conductive layer 1010, a photovoltaic conversion layer 1001 formed on the N-doped semiconductor layer 1020, a P-doped semiconductor layer 1060 on the photovoltaic conversion layer 1001, and a second conductive layer 1070 formed on the P-doped semiconductor layer 1060.

The N-doped semiconductor layer 1020 comprises N-doped silicon, and the P-doped semiconductor layer 1060 comprises P-doped silicon.

The photovoltaic conversion layer 1001 includes a plurality of silicon nanocryatals with a multi-band gap. In one embodiment, the photovoltaic conversion layer 1001 comprises a single layer with the multi-band gap. The single layer can be formed of nc-Si having a plurality of silicon nanocryatals with a multi-band gap. In another embodiment, the photovoltaic conversion layer 1001 comprises a multilayer structure having at least one layer including a plurality of silicon nanocryatals with a multi-band gap.

For the multilayer structure, the photovoltaic conversion layer 1001, in one embodiment, has a first Si-rich dielectric sub-layer 1030 formed on the N-doped semiconductor layer 1020, a second Si-rich dielectric sub-layer 1040 formed on the first Si-rich dielectric sub-layer 1030, and a third Si-rich dielectric sub-layer 1050 formed on the second Si-rich dielectric sub-layer 1040. Each of the first Si-rich dielectric sub-layer 1030, the second Si-rich dielectric sub-layer 1040 and the third Si-rich dielectric sub-layer 1050 has a corresponding refractive index n1, n2 and n3, respectively, where n3<n2<n1. In an alternative embodiment, the first Si-rich dielectric sub-layer 1030 and the third Si-rich dielectric sub-layer 1050 can be exchanged. In one embodiment, each of the first Si-rich dielectric sub-layer 1030, the second Si-rich dielectric sub-layer 1040 and the third Si-rich dielectric sub-layer 1050 comprises Si-rich oxide, Si-rich nitride, Si-rich oxy-nitride, Si-rich carbide, or a combination of them. After the photovoltaic conversion layer 1001 is formed, a laser-annealing process may be applied to the photovoltaic conversion layer 1001 to form one or more layers having a plurality of laser-induced silicon nanocryatals with a multi-band gap. In modified embodiment, a first semiconductor layer 920 (not shown) may be formed between the N-doped semiconductor layer 1020 and the multilayer structure, and a second semiconductor layer 960 may be formed between multilayer structure and the P-doped semiconductor layer 1060.

In another embodiment, the photovoltaic conversion layer 1001 has a first silicon sub-layer 1030 formed on the N-doped semiconductor layer 1020, an nc-Si sub-layer 1040 formed on a first silicon sub-layer 1030, and a second silicon sub-layer 1050 formed on the nc-Si sub-layer 1040. One of the first silicon sub-layer 1030 and the second silicon sub-layer 1050 is formed of a-Si, and the other of the first silicon sub-layer 1030 and the second silicon sub-layer 1050 formed of poly-Si. Accordingly, the photovoltaic conversion layer 1001 has a multi-band gap, a-Si/Si-nanocrystals/poly-Si layered structure.

The first conductive layer 1010 and the second conductive layer 1070 may be formed with metal, metal oxide, or any combinations of these materials. The metal may be reflective materials comprise aluminum, copper, silver, gold, titanium, molybdenum, lithium, tantalum, neodymium, tungsten, alloy, others, or any combinations of these metals. The metal oxide may be transparent conductive materials comprise ITO, IZO, AZO, HfO, or the like. The metal may be a combination of the reflective materials and the transparent conductive materials. In practice, at least one of the first conductive layer and the second conductive layer is made of a transparent conductive material, such as ITO, IZO, AZO, HfO, or the like.

The photovoltaic cell of the present invention can find many applications in a wide spectrum of fields, such as a photo detector, and a display panel including a touch panel, a non-volatile memory device.

Referring to FIG. 11A, a display panel 1101 integrating with one or more photovoltaic cells (photo sensors) 1140 is shown according to one embodiment of the present invention. The display panel 1101 includes a display area 1110 for displaying information of interest, and one or more photovoltaic cells 1140 positioned in an area surrounding the display area 1110 and exposed to a backlight. Each of the one or more photovoltaic cells 1140 has a Si-rich dielectric layer with silicon nanocrystals having a multi-band gap and is adapted for converting optical energy into electrical energy. The optical energy may be received from the backlight and/or ambient light.

The display panel 1101 may also include a display area 1120 for transferring information and receiving user input, a photo detector 1130 for detecting light, and an ambient light sensor 1150 for detecting ambient light. Each of them has at least one Si-rich dielectric layer with silicon nanocrystals.

The photo detector 1130 and the ambient light sensor 1150 can be positioned in any corner area to detect ambient light or other light. The one or more photovoltaic cells 1140 can be positioned around the display area 1110 to convert the light received therein into electric energy to save energy consumed by the display panel 1101.

The display panel 1101 can be a touch panel, or an LCD panel.

FIG. 11B shows schematically an LCD panel 1102 with an LCD driver 1160 for operably driving the LCD panel 1102, and a backlight 1170 for illuminating the LCD panel 1102. The LCD panel 1102 has a display area 1110 for displaying information of interest; and one or more photovoltaic cells 1140 positioned in an area surrounding the display area 1110 and exposed to the backlight 1170. Each of the one or more photovoltaic cells 1140 includes a multi-layered structure having a Si-rich dielectric layer with silicon nanocrystals, and is adapted for converting optical energy into electrical energy. The optical energy is received from the backlight and/or ambient light. The electrical energy is supplied to the LCD driver 1160 as a driving power.

The methods disclosed in the present invention may be used to manufacture photovoltaic layer for light emitting devices, and/or photosensitive layer for light detection devices, with a high efficiency laser annealing process at low temperature. The laser-induced silicon nanocrystals in the dielectric layer made according to embodiments of the present invention exhibit a high density, quite uniform and consistent distribution of the laser-induced silicon nanocrystals, and consistent diameters of the laser-induced silicon nanocrystals. The methods use excimer laser annealing process at a low temperature. This process does not require high temperature post annealing and is compatible with the conventional process to produce LTPS-TFT. The Si-rich dielectric layer with laser-induced silicon nanocrystals manufactured according to several embodiments of the present invention is usable for solar cells, touch panels, ambient light sensor, photodetectors, and also integrable with a full color high quality TFT flat panel display. The laser-induced silicon nanocrystals manufactured according to several embodiments of the present invention is also usable as a storage node in non-volatile memory devices, with higher retention, higher endurance and higher operating speed.

Figure 12:
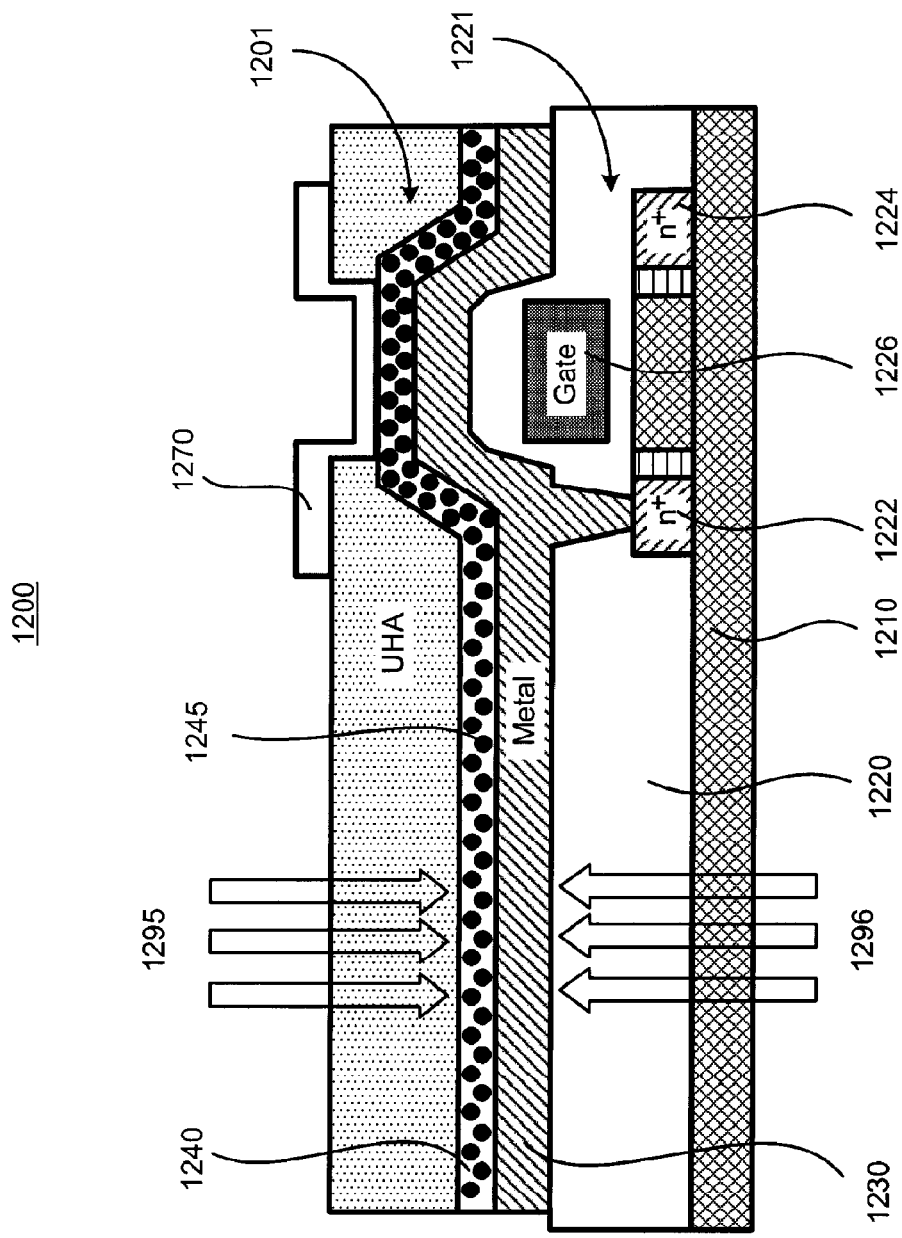
FIG. 12 shows schematically a cross-sectional view of an LTPS panel integrating with a plurality of Si-nanocrystal photovoltaic cells according to one embodiment of the present invention.

FIG. 12 shows schematically an LTPS panel 1200 integrating with photovoltaic cells (or photo sensors) according to one embodiment of the present invention. The LTPS panel 1200 may have a plurality of pixels arranged in the form of matrix. In FIG. 12, only one pixel of the LTPS panel 1200 is illustrated. In this embodiment, each pixel has a readout TFT 1221, and a photovoltaic cell 1201 formed over the readout TFT 1221.

The photovoltaic cell 1201 has a three-layer stacked structure including a first conductive layer 1230, a second conductive layer 1270, and a Si-rich dielectric layer 1240 formed therebetween and having a plurality of silicon nanocrystals 1245.

The readout TFT 1220 is formed on a substrate 1210. The readout TFT 1221 has a source region 1222, which is electrically coupled to the first conductive layer 1230 of the photovoltaic cell 1201, a drain region 1224 and a gate electrode 1226. The drain region 1224 (the source region 1222) and the gate electrode 1226 are separated by a gate insulating layer 1220 that is formed on the substrate 1210. The substrate 1210 is formed as a transparent substrate such as a glass substrate, or a flexible substrate such as a plastic substrate.

When such a photovoltaic cell 1201 is utilized in a display panel 1200, the photovoltaic cell 1201 is configured to face an ambient light 1295. Additionally, a backlight 1296 is usually used to illuminate the display panel 1200 to display information thereon. In order to prevent the backlight 1296 from biasing output of the photovoltaic cell 1201, the first conductive layer 1230 is utilized to effectively block the backlight 1296.

In one embodiment, the Si-rich dielectric layer 1240 of the photovoltaic cell 1201 is made of Si-rich oxide, Si-rich nitride, Si-rich oxy-nitride, Si-rich carbide, or the like. The Si-rich oxide layer, preferred, has a refractive index in the range of about 1.7-3.7, and the silicon-rich nitride layer, preferred, has a refractive index in the range of about 1.7-3.7. At least some of the silicon nanocrystals, preferred, have diameters ranging from about 2-10 nm. The thickness of the Si-rich dielectric layer 1240 is in the range of about 50-500 nm. The density of the laser-induced silicon nanocrystals, preferred, range from about $1\times10^{11}$-$1\times10^{12}$/cm$^2$. The second conductive layer 1270 is preferably made of transparent conductive material, such as ITO, IZO, AZO, HfO, or the like.

As shown in FIG. 12, the fill factor of Si-nanocrystal unit is much higher than conventional units, because the photovoltaic cell 1201 is formed to cover a larger, switch area where the readout TFT 1221 is placed. Furthermore, the metal electrode 1230 can provide effective ambient light and backlight shielding to the unit circuitry and photovoltaic cell 1201, respectively, so that the transistor characteristics are more stable than those in a P-I-N unit.

Figure 13:
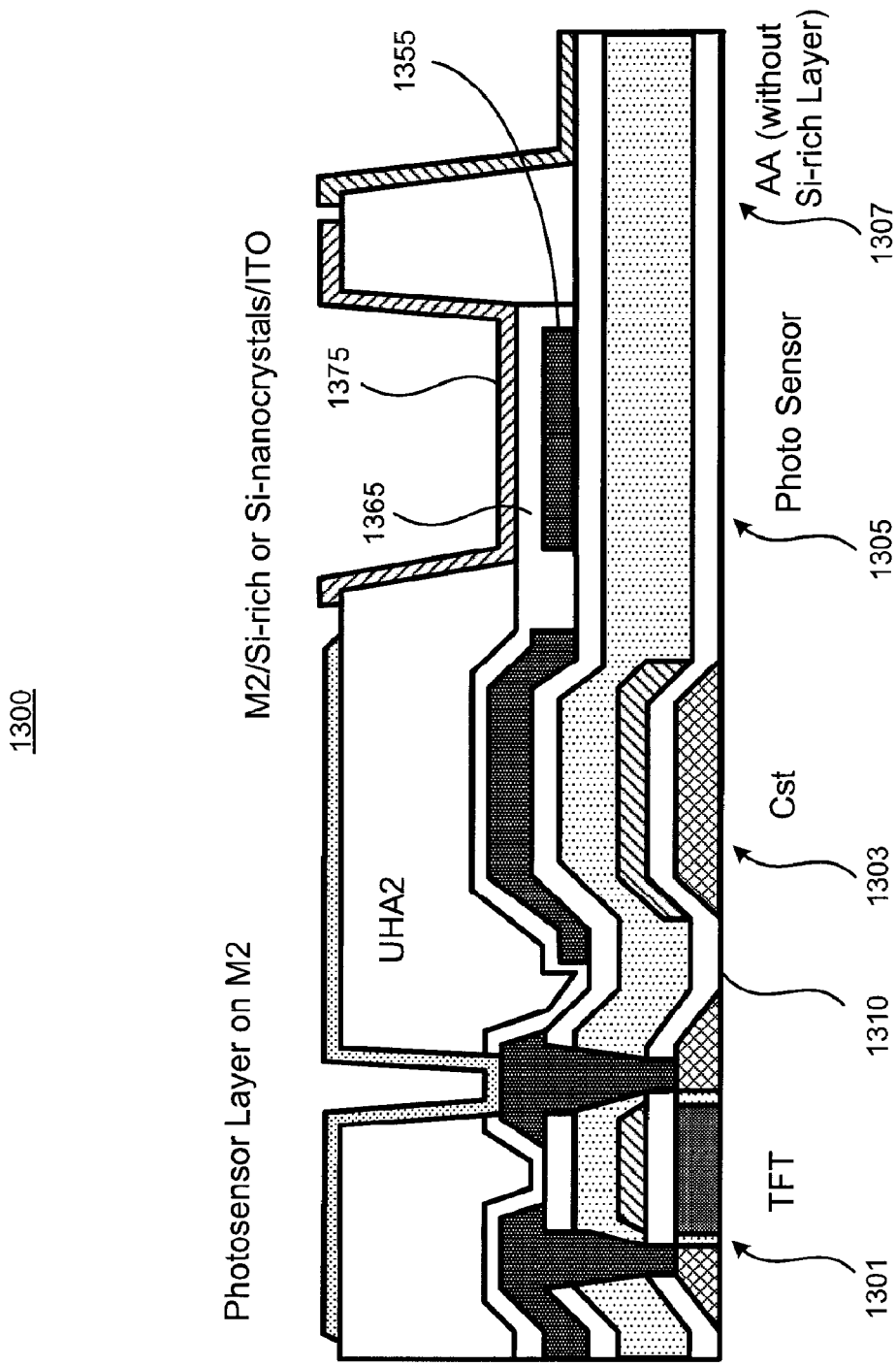
FIG. 13 shows schematically a cross-sectional view of an LTPS panel integrating with a plurality of Si-nanocrystal photovoltaic cells according to another embodiment of the present invention.

Referring to FIG. 13, an LTPS panel 1300 integrating with photovoltaic cells (or photo sensors) according to another embodiment of the present invention. In this embodiment, each pixel has a TFT 1301, a storage capacitor 1303, a photo sensor 1305 and an active area 1307 formed one adjacent to another on a substrate 1310. The photo sensor 1305 includes a first electrode 1355, a second electrode 1375 and a Si-rich dielectric layer 1365 formed therebetween. The process for fabricating the a-Si TFT panel 1300 in one embodiment is illustrated in FIG. 14

Referring now to FIG. 14, a method 1400 of fabricating an a-Si TFT panel integrating photovoltaic cells (or photo sensors) is schematically shown according to one embodiment of the present invention. The method includes the following steps. At first, a first substrate 1410 is provided. The first substrate 1410 is formed of glass, or the likes. Then, a plurality of gate electrodes 1420 electrically coupled to a gate line is formed spatially apart from one another on the first substrate 1410. The step of forming the plurality of gate electrodes 1420 is performed by, first, depositing a metal layer on the substrate 1410 with the sputter method, masking the metal layer at appropriate positions to define the plurality of gate electrodes 1420 therewith, then, exposing it to a light so as to uncover the remaining portion of the metal layer, etching out the uncovered portion of the metal layer, and removing the mask portion to form the plurality of gate electrodes 1420. Each pair of adjacent gate electrodes 1420 defining a switch area 1412 and a solar cell area 1414 therebetween. The solar cell area 1414 is adjacent to a switching area 1412 in which a corresponding gate electrode 1420 is formed, as shown in FIG. 14A. The gate electrode 1420 is formed of a metal such as aluminum (Al), molybdenum (Mo), chromium (Cr), tantalum (Ta), copper (Cu), or alloy.

A dielectric layer (gate insulation film) 1430 is formed on the first substrate 1410 and the plurality of gate electrodes 1420. In one embodiment, the gate insulation film 1430 is formed of silicon oxide, silicon nitride, or silicon oxynitride.

Then, an a-Si layer 1442 is formed on the gate insulation layer 1430 over the gate electrode 1420 in each switch area 1412, and a doped a-Si layer 1444 is sequentially formed on the a-Si layer 1442. The doped a-Si layer 1444 is formed of n$^+$ doped a-Si or p$^+$ doped a-Si, and serves as a contact layer, as shown in FIG. 14B. In one embodiment, the a-Si layer 1442 and the contact layer 1444 are formed in such a manner that the a-Si and the doped a-Si are successively deposited by PECVD and then patterned.

Alternatively, the gate insulation film 1430 of silicon oxide or silicon nitride, the a-Si layer 1442, and the doped a-Si layer 1444 are sequentially be deposited, and the a-Si layer 1442 and the doped a-Si layer 1444 are then patterned to form the a-Si layer 1442 and the doped a-Si layer 1444, as shown in FIG. 14B.

Afterwards, a metal layer 1450 is formed on the gate insulation layer 1430 and the contact layer 1444 in each switching area 1412. Then, a Si-rich dielectric layer 1460 is formed on the metal layer over each solar cell area 1414, as shown in FIG. 14C.

As shown in FIG. 14D, masking, exposing and etching processes are sequentially applied to the metal layer 1450 to further define the TFT in each switch area 1412, where the contact layer 1444 is divided into a source port 1444*a* and a drain port 1444*b*, and the metal layer 1450 is also divided into a first portion 1452 and a second portion 1454 in each switch area 1412. The first portion 1452 is connected to the source port 1444*a* and a signal line, and the second portion 1454 is separated from the first portion 1452 and connected to the drain port 1444*b*, as shown in FIG. 14D. Additionally, a third portion 1456 of the metal layer 1450 that are separated from the first portion 1452 and the second portion 1454 is formed in each solar cell area, which, as discussed below, serves as a first electrode of a solar cell.

As shown in FIG. 14E, a protection layer (film) 1470 is then formed all over the TFT in each switching area 1412 and the Si-rich dielectric layer 1460 in each solar cell area 1414. Then, masking, exposing and etching processes are sequentially applied to the protection layer 1470 to define a via hole 1472 for coupling the switch element (through the drain electrode 1454) with the pixel electrode, and to uncover the Si-rich dielectric layer 1460. At this stage, a laser-annealing process may be applied to the Si-rich dielectric layer 1460 to form a plurality of laser-induced silicon nanocrystals with multi-band gap.

The next step, as shown in FIG. 14F, is to form a transparent metal layer having a first portion 1482 over the via hole 1472 and a separated second portion 1484 over the Si-rich dielectric layer 1460. The first portion 1482 is connected to the drain electrode 1454 of the TFT and serves as a pixel electrode. The second portion 1484 of the transparent metal layer, the Si-rich dielectric layer 1460 and the third portion 1456 of the metal layer 1450 constitute a solar cell. The transparent metal layer is formed of a transparent, conductive material including IZO, amorphous ITO, poly ITO, or the like, with a thickness in the range of about 0.01-3.0 μm.

The present invention, among other things, discloses a Si-nanocrystal, multi-band gap photovoltaic cell and applications of same. The photovoltaic cell has a nanocrystal layer formed by post-annealing of silicon rich oxide layer. The Si nanocrystal photovoltaic cell (or photo-sensor) can be a stable, profitable, flexible, reliable and functional element in the application of embedded LCD display panels with the advantages of large fill factor, complete backlights shielding and tunable absorption spectrum.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A photovoltaic cell, comprising:
a first conductive layer;
a second conductive layer; and
a photovoltaic conversion layer formed between the first conductive layer and the second conductive layer, wherein the photovoltaic conversion layer has a multi-band gap, and the photovoltaic conversion layer comprises:
a first silicon-rich dielectric sub-layer formed between the first conductive layer and the second conductive layer, the first silicon-rich dielectric sub-layer having a first silicon content ratio and a first refractive index n1 corresponding to the first silicon content ratio;
a second silicon-rich dielectric sub-layer formed between the first silicon-rich dielectric sub-layer and the second conductive layer, the second silicon-rich dielectric sub-layer having a second silicon content ratio and a second refractive index n2 corresponding to the second silicon content ratio, wherein the second silicon content ratio is smaller than the first silicon content ratio, and the second refractive index n2 is smaller than the first refractive index n1; and
a third silicon-rich dielectric sub-layer formed between the second silicon-rich dielectric sub-layer and the second conductive layer, the third silicon-rich dielectric sub-layer having a third silicon content ratio and a third refractive index n3 corresponding to the third silicon content ratio, wherein the third silicon content ratio is smaller than the second silicon content ratio, and the third refractive index n3 is smaller than the second refractive index n2,
wherein the first silicon-rich dielectric sub-layer and the second silicon-rich dielectric sub-layer are substantially in contact with each other, and the second silicon-rich dielectric sub-layer and the third silicon-rich dielectric sub-layer are substantially in contact with each other; and
wherein each of the first silicon-rich dielectric sub-layer, the second silicon-rich dielectric sub-layer and the third silicon-rich dielectric sub-layer includes a plurality of silicon nanocrystals therein.

2. The photovoltaic cell of claim 1, wherein each of the first silicon-rich dielectric sub-layer and the second silicon-rich dielectric sub-layer is formed of a material comprising silicon-rich oxide, silicon-rich nitride, silicon-rich oxy-nitride, silicon-rich carbide, or a combination of them.

3. The photovoltaic cell of claim 1, wherein the silicon nanocrystals have a size in a range of about 1-20 nm.

4. The photovoltaic cell of claim 1, wherein each of the first silicon-rich dielectric sub-layer, the second silicon-rich dielectric sub-layer and the third silicon-rich dielectric sub-layer is formed of a material comprising silicon-rich oxide, silicon-rich nitride, silicon-rich oxy-nitride, silicon-rich carbide, or a combination of them.

5. The photovoltaic cell of claim 1, wherein the photovoltaic conversion layer further comprises:
(i) an amorphous silicon (a-Si) layer; and
(ii) a polycrystalline silicon (poly-Si) layer,
wherein the first silicon-rich dielectric sub-layer and the second silicon-rich dielectric sub-layer are formed between the a-Si layer and the poly-Si layer.

6. The photovoltaic cell of claim 1, further comprising:
(i) an N-doped semiconductor layer formed between the first conductive layer and the photovoltaic conversion layer; and
(ii) a P-doped semiconductor layer formed between the second conductive layer and the photovoltaic conversion layer.

7. The photovoltaic cell of claim 1, wherein at least one of the first and second conductive layers is formed of a transparent conductive material.

8. The photovoltaic cell of claim 1, wherein the multi-band gap is in a range about 4.1 eV to about 1.2 eV.

9. The photovoltaic cell of claim 1, wherein the first silicon-rich dielectric sub-layer and the second silicon-rich dielectric sub-layer substantially in contact with each other define a single junction therebetween.

10. A photovoltaic cell, comprising:
a first conductive layer;
a second conductive layer; and
a photovoltaic conversion layer formed between the first conductive layer and the second conductive layer, wherein the photovoltaic conversion layer has a multi-band gap, and the photovoltaic conversion layer comprises:
a first silicon-rich dielectric sub-layer formed between the first conductive layer and the second conductive layer, the first silicon-rich dielectric sub-layer having a first silicon content ratio and a first refractive index $n1$ corresponding to the first silicon content ratio;
a second silicon-rich dielectric sub-layer formed between the first silicon-rich dielectric sub-layer and the second conductive layer, the second silicon-rich dielectric sub-layer having a second silicon content ratio and a second refractive index $n2$ corresponding to the second silicon content ratio; and
a third silicon-rich dielectric sub-layer formed between the second silicon-rich dielectric sub-layer and the second conductive layer, the third silicon-rich dielectric sub-layer having a third silicon content ratio and a third refractive index $n3$ corresponding to the third silicon content ratio,
wherein the first silicon-rich dielectric sub-layer and the second silicon-rich dielectric sub-layer are substantially in contact with each other, and wherein the second silicon-rich dielectric sub-layer and the third silicon-rich dielectric sub-layer are substantially in contact with each other,
wherein the second silicon content ratio is smaller than the first silicon content ratio, and the second refractive index $n2$ is smaller than the first refractive index $n1$, and wherein the third silicon content ratio is smaller than the second silicon content ratio, and the third refractive index $n3$ is smaller than the second refractive index $n2$.

11. The photovoltaic cell of claim 10, wherein each of the first silicon-rich dielectric sub-layer, the second silicon-rich dielectric sub-layer and the third silicon-rich dielectric sub-layer includes a plurality of silicon nanocrystals therein.

12. The photovoltaic cell of claim 11, wherein the silicon nanocrystals have a size in a range of about 1-20 nm.

13. The photovoltaic cell of claim 10, wherein each of the first silicon-rich dielectric sub-layer, the second silicon-rich dielectric sub-layer and the third silicon-rich dielectric sub-layer is formed of a material comprising silicon-rich oxide, silicon-rich nitride, silicon-rich oxy-nitride, silicon-rich carbide, or a combination of them.

14. The photovoltaic cell of claim 10, wherein the photovoltaic conversion layer further comprises:
(i) an amorphous silicon (a-Si) layer; and
(ii) a polycrystalline silicon (poly-Si) layer,
wherein the first silicon-rich dielectric sub-layer and the second silicon-rich dielectric sub-layer are formed between the a-Si layer and the poly-Si layer.

15. The photovoltaic cell of claim 10, further comprising:
(i) an N-doped semiconductor layer formed between the first conductive layer and the photovoltaic conversion layer; and
(ii) a P-doped semiconductor layer formed between the second conductive layer and the photovoltaic conversion layer.

16. The photovoltaic cell of claim 10, wherein at least one of the first and second conductive layers is formed of a transparent conductive material.

17. The photovoltaic cell of claim 10, wherein the multi-band gap is in a range about 4.1 eV to about 1.2 eV.

18. The photovoltaic cell of claim 10, wherein the first silicon-rich dielectric sub-layer and the second silicon-rich dielectric sub-layer define a single junction therebetween, and the second silicon-rich dielectric sub-layer and the third silicon-rich dielectric sub-layer define a single junction therebetween.

19. A liquid crystal display (LCD) panel operably drivable by an LCD driver and illuminable by a backlight, comprising:
(a) a display area for displaying information of interest; and
(b) a photovoltaic cell positioned in an area surrounding the display area and exposed to a light and adapted for converting the optical energy of the light into an electrical energy that is supplied to the LCD driver as a driving power, wherein the photovoltaic cell comprises:
(i) a first conductive layer;
(ii) a second conductive layer; and
(iii) a photovoltaic conversion layer formed between the first conductive layer and the second conductive layer, wherein the photovoltaic conversion layer has a multi-band gap, and the photovoltaic conversion layer comprises:
a first silicon-rich dielectric sub-layer formed between the first conductive layer and the second conductive layer; the first silicon-rich dielectric sub-layer having a first silicon content ratio and a first refractive index $n1$ corresponding to the first silicon content ratio;
a second silicon-rich dielectric sub-layer formed between the first silicon-rich dielectric sub-layer and the second conductive layer, the second silicon-rich dielectric sub-layer having a second silicon content ratio and a second refractive index $n2$ corresponding to the second silicon content ratio, wherein the second silicon content ratio is smaller than the first silicon content ratio, and the second refractive index $n2$ is smaller than the first refractive index $n1$; and
a third silicon-rich dielectric sub-layer formed between the second silicon-rich dielectric sub-layer and the second conductive layer, the third silicon-rich dielectric sub-layer having a third silicon content ratio and a third refractive index $n3$ corresponding to the third silicon content ratio, wherein the third silicon content ratio is smaller than the second silicon content ratio, and the third refractive index n3 is smaller than the second refractive index n2, wherein the first silicon-rich dielectric sub-layer and the second silicon-rich dielectric sub-layer are substantially in contact with each other, and the second silicon-rich dielectric sub-layer and the third silicon-rich dielectric sub-layer are substantially in contact with each other; and wherein each of the first silicon-rich dielectric sub-layer, the second silicon-rich dielectric sub-layer and the third silicon-rich dielectric sub-layer includes a plurality of silicon nanocrystals therein.

20. The LCD panel of claim 19, wherein the photovoltaic conversion layer further comprises:
   (i) an amorphous silicon (a-Si) layer formed between the first conductive layer and the first silicon-rich dielectric sub-layer; and
   (ii) a polycrystalline silicon (poly-Si) layer formed between the second silicon-rich dielectric sub-layer and the second conductive layer.

21. The LCD panel of claim 20, wherein each of the first silicon-rich dielectric sub-layer and the second silicon-rich dielectric sub-layer is formed of a material comprising silicon-rich oxide, silicon-rich nitride, silicon-rich oxy-nitride, silicon-rich carbide, or a combination of them.

22. The LCD panel of claim 21, wherein the silicon nanocrystals have a size in a range of about 1-20 nm.

23. The LCD panel of claim 19, wherein the display area comprises a plurality of low temperature polycrystalline silicon thin film transistors (LTPS-TFTs).

24. A display panel having a plurality of pixels arranged in the form of matrix, each pixel comprising:
   (a) an active area for displaying information of interest;
   (b) a switch area having one or more switch elements; and
   (c) a photovoltaic cell formed between the active area and the switch area, wherein the photovoltaic cell has a photovoltaic conversion layer with a multi-band gap, and the photovoltaic conversion layer comprises:
      a first silicon-rich dielectric sub-layer formed between the first conductive layer and the second conductive layer; the first silicon-rich dielectric sub-layer having a first silicon content ratio and a first refractive index n1 corresponding to the first silicon content ratio;
      a second silicon-rich dielectric sub-layer formed between the first silicon-rich dielectric sub-layer and the second conductive layer, the second silicon-rich dielectric sub-layer having a second silicon content ratio and a second refractive index n2 corresponding to the second silicon content ratio, wherein the second silicon content ratio is smaller than the first silicon content ratio, and the second refractive index n2 is smaller than the first refractive index n1; and
      a third silicon-rich dielectric sub-layer formed between the second silicon-rich dielectric sub-layer and the second conductive layer, the third silicon-rich dielectric sub-layer having a third silicon content ratio and a third refractive index n3 corresponding to the third silicon content ratio, wherein the third silicon content ratio is smaller than the second silicon content ratio, and the third refractive index n3 is smaller than the second refractive index n2, wherein the first silicon-rich dielectric sub-layer and the second silicon-rich dielectric sub-layer are substantially in contact with each other, the second silicon-rich dielectric sub-layer and the third silicon-rich dielectric sub-layer are substantially in contact with each other, and define a single junction therebetween; and wherein each of the first silicon-rich dielectric sub-layer, the second silicon-rich dielectric sub-layer and the third silicon-rich dielectric sub-layer includes a plurality of silicon nanocrystals therein.

25. The display panel of claim 24, wherein the photovoltaic conversion layer comprises:
   (i) an amorphous silicon (a-Si) layer formed between the first conductive layer and the first silicon-rich dielectric sub-layer; and
   (ii) a polycrystalline silicon (poly-Si) layer formed between the second silicon-rich dielectric sub-layer and the second conductive layer.

26. The display panel of claim 25, wherein the silicon nanocrystals have a size in a range of about 1-20 nm.

* * * * *